(12) United States Patent
Yaoi et al.

(10) Patent No.: US 8,901,860 B2
(45) Date of Patent: Dec. 2, 2014

(54) PHOTOVOLTAIC APPARATUS, MAXIMUM POWER POINT TRACKING CONTROL METHOD AND COMPUTER PROGRAM IN THE SAME, AND MOVING BODY INCLUDING THE SAME

(71) Applicant: Sharp Kabushiki Kaisha, Osaka (JP)

(72) Inventors: Yoshifumi Yaoi, Osaka (JP); Kohtaroh Kataoka, Osaka (JP); Masatomi Harada, Osaka (JP); Kohichiroh Adachi, Osaka (JP); Yoshiji Ohta, Osaka (JP); Hiroshi Iwata, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 100 days.

(21) Appl. No.: 13/845,827

(22) Filed: Mar. 18, 2013

(65) Prior Publication Data

US 2013/0241448 A1    Sep. 19, 2013

(30) Foreign Application Priority Data

Mar. 19, 2012 (JP) .................................. 2012-062393

(51) Int. Cl.
*H01L 31/042* (2014.01)

(52) U.S. Cl.
USPC ........... 318/139; 318/571; 318/572; 136/244; 136/246

(58) Field of Classification Search
USPC .................. 318/139, 571, 572; 136/244, 246
See application file for complete search history.

(56) References Cited

U.S. PATENT DOCUMENTS

| | | | | |
|---|---|---|---|---|
| 4,354,484 A * | 10/1982 | Malone et al. | ................. | 126/602 |
| 6,442,937 B1 * | 9/2002 | Stone et al. | ................. | 60/641.11 |
| 6,844,739 B2 * | 1/2005 | Kasai et al. | ................... | 324/611 |
| 7,109,461 B2 * | 9/2006 | Lasich | ....................... | 250/203.4 |
| 7,772,716 B2 * | 8/2010 | Shaver et al. | ...................... | 307/31 |
| 8,035,249 B2 * | 10/2011 | Shaver et al. | ................... | 307/31 |
| 8,129,667 B2 * | 3/2012 | Moore et al. | ............... | 250/203.4 |
| 8,152,108 B2 * | 4/2012 | Becker-Irvin et al. | ..... | 244/172.7 |
| 8,247,753 B2 * | 8/2012 | Hong et al. | ................ | 250/203.4 |
| 8,401,706 B2 * | 3/2013 | Moore et al. | ................... | 700/286 |
| 8,427,009 B2 * | 4/2013 | Shaver et al. | ................... | 307/31 |
| 2002/0163323 A1* | 11/2002 | Kasai et al. | .................... | 323/284 |
| 2004/0079863 A1* | 4/2004 | Lasich | ....................... | 250/203.4 |
| 2008/0147335 A1* | 6/2008 | Adest et al. | ..................... | 702/64 |
| 2008/0238195 A1* | 10/2008 | Shaver et al. | ................... | 307/18 |
| 2009/0205637 A1* | 8/2009 | Moore et al. | ................... | 126/576 |
| 2009/0310391 A1* | 12/2009 | Becker-Irvin et al. | .......... | 363/79 |

(Continued)

FOREIGN PATENT DOCUMENTS

| | | |
|---|---|---|
| JP | 8-153883 | 6/1996 |
| JP | 2009-117658 | 5/2009 |

(Continued)

*Primary Examiner* — Paul Ip
(74) *Attorney, Agent, or Firm* — Nixon & Vanderhye, P.C.

(57) ABSTRACT

A photovoltaic apparatus according to the present invention includes a photovoltaic module and a tracking control device. The photovoltaic module includes a plurality of series portions coupled in parallel. The series portion includes a plurality of photovoltaic elements coupled in series. The photovoltaic elements coupled in a same straight row of the plurality of series portions are coupled parallel to one another. The tracking control device is configured to perform a maximum power point tracking control on an output of the photovoltaic module. The photovoltaic module includes a temperature sensor that detects a real panel temperature that is a panel temperature when the photovoltaic module is operating.

12 Claims, 18 Drawing Sheets

(56) References Cited

U.S. PATENT DOCUMENTS

| | | | |
|---|---|---|---|
| 2010/0052425 A1* | 3/2010 | Moore et al. | 307/52 |
| 2010/0059043 A1* | 3/2010 | Hong et al. | 126/573 |
| 2010/0286836 A1* | 11/2010 | Shaver et al. | 700/287 |
| 2011/0071706 A1* | 3/2011 | Crumm et al. | 701/3 |
| 2011/0071707 A1* | 3/2011 | Crumm et al. | 701/3 |
| 2012/0091968 A1* | 4/2012 | Heo et al. | 320/138 |
| 2012/0133322 A1* | 5/2012 | Walsh et al. | 320/101 |
| 2012/0136534 A1* | 5/2012 | Walsh et al. | 701/36 |
| 2012/0266938 A1* | 10/2012 | Goei et al. | 136/246 |
| 2012/0293021 A1* | 11/2012 | Teggatz et al. | 307/151 |
| 2012/0326649 A1* | 12/2012 | Patanaik et al. | 318/453 |
| 2013/0002142 A1* | 1/2013 | Sawada et al. | 315/152 |
| 2013/0006435 A1* | 1/2013 | Berrios et al. | 700/295 |
| 2013/0048048 A1* | 2/2013 | Flanery et al. | 136/246 |
| 2013/0048049 A1* | 2/2013 | Flanery | 136/246 |
| 2013/0332093 A1* | 12/2013 | Adest et al. | 702/60 |

FOREIGN PATENT DOCUMENTS

| | | |
|---|---|---|
| JP | 2010-287795 | 12/2010 |
| JP | 2011-206423 | 10/2011 |
| JP | 2011-222005 | 11/2011 |
| JP | 2012-039224 | 2/2012 |
| JP | 2012-060902 | 3/2012 |
| JP | 2012-060906 | 3/2012 |
| JP | 2012-169581 | 9/2012 |

* cited by examiner

FIG.4

| D1a | D1b | D1c | D1d | D1e | D1f | D1g | D1h |
|-----|-----|-----|-----|-----|-----|-----|-----|
| D2a | D2b | D2c | D2d | D2e | D2f | D2g | D2h |
| D3a | D3b | D3c | D3d | D3e | D3f | D3g | D3h |

PANEL TEMPERATURE-OUTPUT CORRELATION
CHARACTERISTIC: LISTED DATA

| PANEL TEMPERATURE Tp (°C) | MPP DATA (CORRESPONDING TO ASSUMED LIGHTING INTENSITY) | |
|---|---|---|
| | MAXIMUM OUTPUT | MAXIMUM POWER OPERATING VOLTAGE |
| ⋮ | ⋮ | ⋮ |
| 0 | Pmx (0) | Vpm (0) |
| ⋮ | ⋮ | ⋮ |
| 25 | Pmx (25) | Vpm (25) |
| ⋮ | ⋮ | ⋮ |
| 50 | Pmx (50) | Vpm (50) |
| ⋮ | ⋮ | ⋮ |
| 75 | Pmx (75) | Vpm (75) |
| ⋮ | ⋮ | ⋮ |

FIG.16

PANEL TEMPERATURE-OUTPUT CORRELATION
CHARACTERISTIC: LISTED DATA

| PANEL TEMPERATURE Tp (°C) | MPP DATA (CORRESPONDING TO ASSUMED LIGHTING INTENSITY) | | |
|---|---|---|---|
| | MAXIMUM OUTPUT | MAXIMUM POWER OPERATING VOLTAGE | OPEN CIRCUIT VOLTAGE |
| ⋮ | ⋮ | ⋮ | ⋮ |
| 0 | Pmx (0) | Vpm (0) | Voc (0) |
| ⋮ | ⋮ | ⋮ | ⋮ |
| 25 | Pmx (25) | Vpm (25) | Voc (25) |
| ⋮ | ⋮ | ⋮ | ⋮ |
| 50 | Pmx (50) | Vpm (50) | Voc (50) |
| ⋮ | ⋮ | ⋮ | ⋮ |
| 75 | Pmx (75) | Vpm (75) | Voc (75) |
| ⋮ | ⋮ | ⋮ | ⋮ |

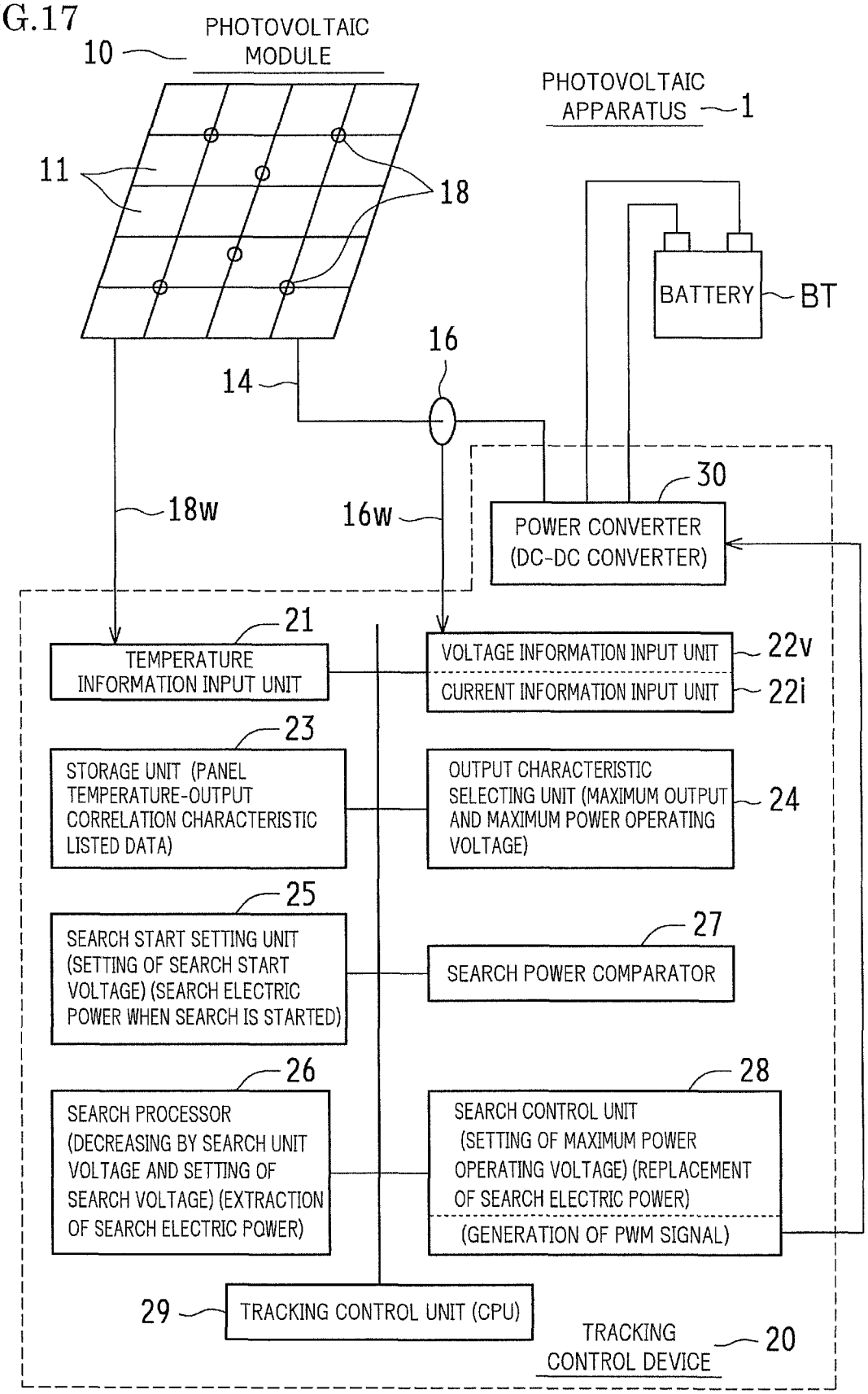

PHOTOVOLTAIC APPARATUS, MAXIMUM POWER POINT TRACKING CONTROL METHOD AND COMPUTER PROGRAM IN THE SAME, AND MOVING BODY INCLUDING THE SAME

CROSS-REFERENCE TO RELATED APPLICATIONS

This application is based on and claims priority under 35 U.S.C. §119 (a) to Japanese Patent Application 2012-062393, filed on Mar. 19, 2012, the entire content of which is incorporated herein by reference.

FIELD

The present invention relates to a photovoltaic apparatus including a photovoltaic module, a maximum power point tracking control method and a computer program in the photovoltaic apparatus, and a moving body.

DESCRIPTION OF THE RELATED ART

In a solar cell module, since an output characteristic (a power-voltage characteristic) has a peak, an operation at the maximum power point is achieved by a maximum power point tracking control (MPPT control).

By referring to FIG. 21 and FIG. 22, a description will be given of a known maximum power point tracking control. FIG. 21 is a characteristic graph illustrating an exemplary MPPT control in a normal output characteristic of a general solar cell module.

In a state of usual sunshine, the output characteristic illustrates a single-peaked curve. Accordingly, the MPPT control simply performs a search Tr1 and a search Tr2 from low voltage toward high voltage (an open circuit voltage Voc side) to extract the maximum power point MPP.

That is, a folding point of the search Tr1, which is a rising track, and the search Tr2, which is a falling track, is extracted as the maximum power point MPP. However, a sweep range Vsp where the search is performed is a wide range from low voltage to high voltage. This makes quick MPPT control difficult. Additionally, the wide sweep range Vsp causes a problem of high power consumption in the control system.

FIG. 22 is a characteristic graph illustrating an exemplary MPPT control with an output characteristic affected by shade in a general solar cell module.

In the known solar cell module, the shade may considerably change the output characteristic and cause, for example, two peaks. In this case, the MPPT control detects a rising track Tr3 and a falling track Tr4 regarding a peak formed at the higher voltage side in addition to the rising track Tr1 and the falling track Tr2 so as to detect the maximum power point MPP. Accordingly, the known problem becomes more obvious.

Regarding a maximum power point tracking control method by a known hill-climbing method, Japanese Unexamined Patent Application Publication No. 2009-117658 is known.

The present invention has been made in view of the above-described circumstances, and it is an object of the present invention to provide a photovoltaic apparatus that ensures a maximum power point tracking control almost without being affected by shade.

Additionally, another object of the present invention is to provide a maximum power point tracking control method and a computer program that improves the photovoltaic apparatus according to the present invention to operate more effectively.

Additionally, another object of the present invention is to provide a moving body that employs the photovoltaic apparatus according to the present invention to eliminate the impact of shade during running, so as to ensure a stable and efficient electric generation and running.

SUMMARY OF THE INVENTION

A photovoltaic apparatus according to the present invention is based on the premise that a photovoltaic apparatus that includes a photovoltaic module and a tracking control device. The photovoltaic module includes a plurality of series portions coupled in parallel. The series portion includes a plurality of photovoltaic elements coupled in series. The photovoltaic elements coupled in a same straight row of the plurality of series portions are coupled parallel to one another. The tracking control device is configured to perform a maximum power point tracking control on an output of the photovoltaic module. The photovoltaic apparatus is characterized by the following. That is, the photovoltaic module includes a temperature sensor configured to detect a real panel temperature when the photovoltaic module is operating. The tracking control device includes a storage unit where a plurality of panel temperature-output correlation characteristics are registered corresponding to the panel temperature, an output characteristic selecting unit, and a search start setting unit. The panel temperature-output correlation characteristic preliminarily specifies a correlation relationship between the panel temperature and a characteristic of the output in the photovoltaic module. The output characteristic selecting unit is configured to: extract one of the panel temperature-output correlation characteristics corresponding to the real panel temperature among the plurality of panel temperature-output correlation characteristics as a virtual panel temperature-output correlation characteristic; and extract a maximum power operating voltage corresponding to a maximum output in the virtual panel temperature-output correlation characteristic. The search start setting unit is configured to select an electric power of the photovoltaic module when a voltage of the photovoltaic module is set to a search start voltage higher than the maximum power operating voltage, as a search electric power when a search is started. The tracking control device is configured to: start a search using the search start voltage and the search electric power when the search is started as references; and extract a maximum power point of the photovoltaic module at the real panel temperature.

Accordingly, the photovoltaic apparatus according to the present invention detects the real panel temperature of the photovoltaic module, and extracts one of the panel temperature-output correlation characteristics corresponding to the real panel temperature as the virtual panel temperature-output correlation characteristic. The photovoltaic apparatus sets the voltage of the photovoltaic module to the search start voltage higher than the maximum power operating voltage in the virtual panel temperature-output correlation characteristic, and starts a search using the search start voltage and the search electric power when the search is started as references to perform the maximum power point tracking control. This allows a simple and accurate setting of the maximum power operating voltage in the detected real panel temperature with a search in a narrow range. This photovoltaic apparatus simply, accurately, and quickly tracks (searches) the maximum power point in the output characteristic of the photovoltaic module.

In the above-described configuration, the photovoltaic apparatus according to the present invention may employ a distributed arrangement where a layout pattern of the photovoltaic elements is different from an arrangement in an equivalent circuit.

In this configuration, the photovoltaic apparatus according to the present invention employs a distributed arrangement as the layout pattern of the photovoltaic elements that constitute the photovoltaic module so as to suppress the impact of shade on the series portion where the photovoltaic elements are coupled in series. This suppresses a decrease in power transmission efficiency, thus improving power extraction efficiency.

Additionally, the photovoltaic apparatus according to the present invention may be configured as follows. The tracking control device may include a search processor, a search power comparator, and a search control unit. The search processor is configured to extract the electric power of the photovoltaic module as a search electric power for search. The electric power is obtained when a voltage of the photovoltaic module is sequentially decreased from the search start voltage by a preliminarily set search unit voltage every time so as to be set to a search voltage for search. The search power comparator is configured to compare the search electric power before the voltage of the photovoltaic module is decreased by the search unit voltage with the search electric power when the voltage of the photovoltaic module is decreased by the search unit voltage. The search control unit configured to: set the voltage of the photovoltaic module before decreasing by the search unit voltage to a maximum power operating voltage at the real panel temperature and terminate the search in a case where the search electric power before the voltage of the photovoltaic module is decreased by the search unit voltage is higher than the search electric power when the voltage of the photovoltaic module is decreased by the search unit voltage; and replace the search electric power before decreasing by the search unit voltage with the search electric power when decreased by the search unit voltage so as to perform a process in the search power comparator in a case where the search electric power before the voltage of the photovoltaic module is decreased by the search unit voltage is lower than the search electric power when the voltage of the photovoltaic module is decreased by the search unit voltage.

With this configuration, the photovoltaic apparatus according to the present invention sequentially decreases the voltage from the search start voltage by the preliminarily set search unit voltage to be set to the search voltage for search, and compares the search electric powers before and after the search voltage is varied by the search unit voltage to perform the maximum power point tracking control. This allows an efficient and quick setting of the maximum power operating voltage with respect to the real panel temperature by the search in the preliminarily set narrow range. Thus, even in the case where the irradiation state of the light is frequently varied, this allows a simple, accurate, and quick tracking of the maximum power point in the output characteristic of the photovoltaic module.

In the photovoltaic apparatus according to the present invention, the panel temperature-output correlation characteristic registered in the storage unit may associate the panel temperature with the maximum power operating voltage that corresponds to the maximum output obtained by a preliminarily assumed lighting intensity at the panel temperature.

With this configuration, the photovoltaic apparatus according to the present invention directly associates the panel temperature with the maximum power operating voltage corresponding to the maximum output at the panel temperature in the panel temperature-output correlation characteristic. Use of the virtual panel temperature-output correlation characteristic corresponding to the detected real panel temperature allows an accurate and quick direct extraction of the maximum power operating voltage of the photovoltaic module. This allows an accurate and quick selection of the search start voltage to perform an accurate and quick maximum power point tracking control.

In the photovoltaic apparatus according to the present invention, in a case where the real panel temperature is different from the panel temperature registered in the storage unit, the output characteristic selecting unit is preferred to extract the panel temperature-output correlation characteristic corresponding to the panel temperature that is lower than and closest to the real panel temperature among the panel temperatures registered in the storage unit as the virtual panel temperature-output correlation characteristic.

With this configuration, the photovoltaic apparatus according to the present invention extracts the panel temperature-output correlation characteristic corresponding to the panel temperature that is lower than and closest to the real panel temperature among the panel temperatures registered in the storage unit as the virtual panel temperature-output correlation characteristic. This allows an extraction of the virtual panel temperature-output correlation characteristic to limit a search range of any real panel temperature to a narrow range and perform the maximum power point tracking control.

In the photovoltaic apparatus according to the present invention, the search start voltage may be calculated by a formula for computation. The formula for computation is preliminarily specified with respect to the maximum power operating voltage.

With this configuration, the photovoltaic apparatus according to the present invention calculates the search start voltage by applying the formula for computation to the maximum power operating voltage in the virtual panel temperature-output correlation characteristic. This allows obtaining the search start voltage accurately and quickly even in any irradiation state of the photovoltaic module.

In the photovoltaic apparatus according to the present invention, the formula for computation may be used to obtain the search start voltage by multiplying the maximum power operating voltage by a coefficient larger than one.

With this configuration, the photovoltaic apparatus according to the present invention obtains the search start voltage by multiplying the maximum power operating voltage by a coefficient larger than one. With any specification of the maximum power operating voltage of the photovoltaic module, this suppresses the impact of the specification to extract an accurate search start voltage.

In the photovoltaic apparatus according to the present invention, the formula for computation may be used to obtain the search start voltage based on an open circuit voltage of the photovoltaic module and the maximum power operating voltage.

With this configuration, the photovoltaic apparatus according to the present invention can apply the formula for computation where the search start voltage is arranged between the maximum power operating voltage and the open circuit voltage. The maximum power operating voltage is known to have a constant relation to the open circuit voltage. This allows a simple and highly accurate calculation of the search start voltage.

In the photovoltaic apparatus according to the present invention, it is preferred that the search unit voltage be set to be smaller than ½ of difference between the maximum power operating voltage and the search start voltage.

With this configuration, the photovoltaic apparatus according to the present invention sets the search unit voltage to a value smaller than ½ of the difference between the maximum power operating voltage and the search start voltage. Accordingly, when a search is performed such that the search voltage is shifted from the search start voltage to the maximum power operating voltage side, the configuration allows performing at least a plurality of searches between the search start voltage and the maximum power operating voltage. This ensures a highly accurate and quick search.

A maximum power point tracking control method according to the present invention is based on the premise that a photovoltaic apparatus that includes a photovoltaic module and a tracking control device. The photovoltaic module includes a plurality of series portions coupled in parallel. The series portion includes a plurality of photovoltaic elements coupled in series. The photovoltaic elements coupled in a same straight row of the plurality of series portions are coupled parallel to one another. The tracking control device is configured to perform a maximum power point tracking control on an output of the photovoltaic module. The photovoltaic apparatus is characterized by the following. That is, the photovoltaic module includes a temperature sensor configured to detect a real panel temperature when the photovoltaic module is operating. The tracking control device includes a storage unit where a plurality of panel temperature-output correlation characteristics are registered corresponding to the panel temperature, an output characteristic selecting unit, and a search start setting unit. The panel temperature-output correlation characteristic preliminarily specifies a correlation relationship between the panel temperature and the output characteristic in the photovoltaic module. The maximum power point tracking control method includes: a step of detecting a real panel temperature by the temperature sensor; a step of extracting one of the panel temperature-output correlation characteristics corresponding to the real panel temperature among the plurality of panel temperature-output correlation characteristics as a virtual panel temperature-output correlation characteristic, and selecting a maximum power operating voltage corresponding to a maximum output in the virtual panel temperature-output correlation characteristic by the output characteristic selecting unit; a step of extracting an electric power of the photovoltaic module when a voltage of the photovoltaic module is set to a search start voltage higher than the maximum power operating voltage, as a search electric power when a search is started, by the search start setting unit; and a step of starting a search using the search start voltage and the search electric power when the search is started as references, and extracting a maximum power point of the photovoltaic module at the real panel temperature by the tracking control device.

Thus, the maximum power point tracking control method according to the present invention includes: detecting a real panel temperature of the photovoltaic module; selecting a maximum power operating voltage corresponding to a maximum output in the virtual panel temperature-output correlation characteristic; extracting an electric power of the photovoltaic module when a voltage of the photovoltaic module is set to a search start voltage higher than the maximum power operating voltage as a search electric power when a search is started; then starting a search using the search start voltage and the search electric power when the search is started as references; and extracting the maximum power point of the photovoltaic module at the real panel temperature. This allows a simple and accurate setting of the maximum power operating voltage at the detected real panel temperature with a search in a narrow range, thus ensuring a simple, accurate, and quick tracking (searching) of the maximum power point of the output characteristic in the photovoltaic module.

A computer program according to the present invention is based on the premise that the computer program for a computer to execute a maximum power point tracking control in a photovoltaic apparatus that includes a photovoltaic module and a tracking control device. The photovoltaic module includes a plurality of series portions coupled in parallel. The series portion includes a plurality of photovoltaic elements coupled in series. The photovoltaic elements coupled in a same straight row of the plurality of series portions are coupled parallel to one another. The tracking control device is configured to perform a maximum power point tracking control on an output of the photovoltaic module. The photovoltaic apparatus is characterized by the following. That is, the photovoltaic module includes a temperature sensor configured to detect a real panel temperature when the photovoltaic module is operating. The tracking control device includes a storage unit where a plurality of panel temperature-output correlation characteristics are registered corresponding to the panel temperature, an output characteristic selecting unit and a search start setting unit. The panel temperature-output correlation characteristic preliminarily specifies a correlation relationship between the panel temperature and the output characteristic in the photovoltaic module. The computer program for a computer executes: a step of detecting a real panel temperature using the temperature sensor by the tracking control device; a step of extracting one of the panel temperature-output correlation characteristics corresponding to the real panel temperature among the plurality of panel temperature-output correlation characteristics as a virtual panel temperature-output correlation characteristic, and selecting a maximum power operating voltage corresponding to a maximum output in the virtual panel temperature-output correlation characteristic by the output characteristic selecting unit; a step of extracting an electric power of the photovoltaic module when a voltage of the photovoltaic module is set to a search start voltage higher than the maximum power operating voltage, as a search electric power when a search is started, by the search start setting unit; and a step of starting a search using the search start voltage and the search electric power when the search is started as references, and extracting a maximum power point of the photovoltaic module at the real panel temperature by the tracking control device.

Accordingly, the computer program according to the present invention makes the computer execute the maximum power point tracking control method in the photovoltaic apparatus according to the present invention. This allows a simple and accurate setting of the maximum power operating voltage at the detected real panel temperature by a search in a narrow range, thus ensuring a simple, accurate, and quick tracking (searching) of the maximum power point of the output characteristic in the photovoltaic module.

A moving body according to the present invention includes a photovoltaic apparatus, a cell power supply, and a motor. The photovoltaic apparatus includes a photovoltaic module and a tracking control device configured to perform a maximum power point tracking control on an output of the photovoltaic module. The cell power supply is charged by the photovoltaic apparatus. The motor is configured to operate with electric power supplied from the cell power supply. The photovoltaic apparatus is the photovoltaic apparatus according the present invention.

Accordingly, the moving body according to the present invention includes the photovoltaic apparatus. The photovoltaic apparatus operates with the maximum output by the maximum power point tracking control corresponding to the real panel temperature that is the panel temperature when the photovoltaic module is operating. The moving body performs a quick and efficient maximum power point tracking control by suppressing power consumption in the control system caused by the maximum power point tracking control. This eliminates the impact of the shade during running to ensure a stable efficient electric generation.

BRIEF DESCRIPTION OF THE DRAWINGS

FIG. 4 is a pattern diagram schematically illustrating a layout pattern in the photovoltaic module illustrated in FIG. 3 and an assumed shade;

FIG. 15 is a data table illustrating an example where data is obtained as a panel temperature-output correlation characteristic with respect to the output characteristic illustrated in FIG. 14 to make listed data;

FIG. 16 is a data table illustrating a modification of the panel temperature-output correlation characteristic where data is obtained as a panel temperature-output correlation characteristic with respect to the output characteristic illustrated in FIG. 14 to make listed data;

FIG. 17 is a block diagram illustrating an overall configuration of a photovoltaic apparatus according to Embodiment 2 of the present invention mainly using functional blocks;

DETAILED DESCRIPTION

Hereinafter, embodiments according to the present invention will be described by referring to the accompanying drawings. First, a principle of the invention will be described. Subsequently, the embodiments will be described.
(Configuration, and Operation and Effect of a Photovoltaic Module to be Applied to the Present Invention)

First, a principle (configuration, operation and effect) of a photovoltaic module to be applied to the present invention will be described by referring to FIG. 1 to FIG. 10.

Figure 5:
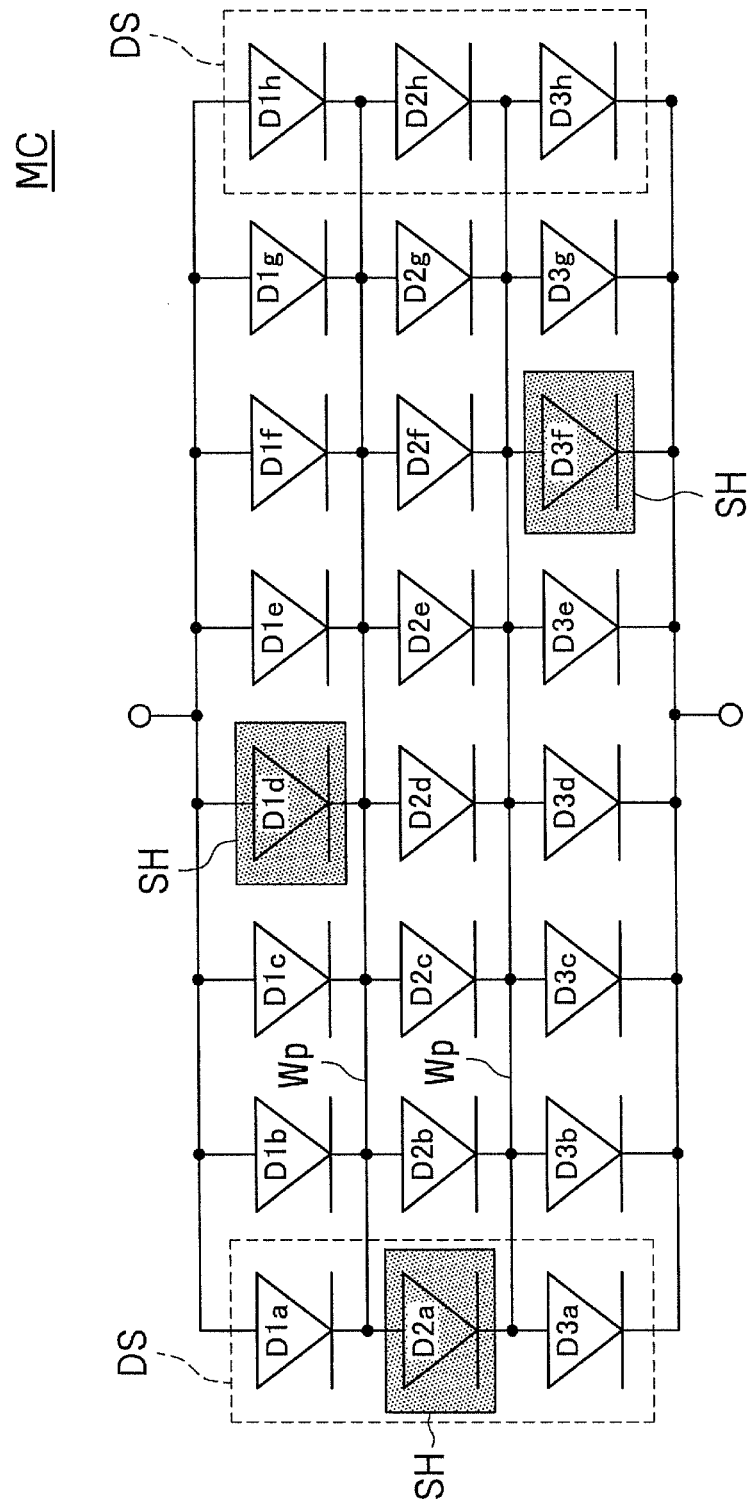
FIG. 5 is an equivalent circuit of a photovoltaic module to be applied to the present invention.
Figure 6:
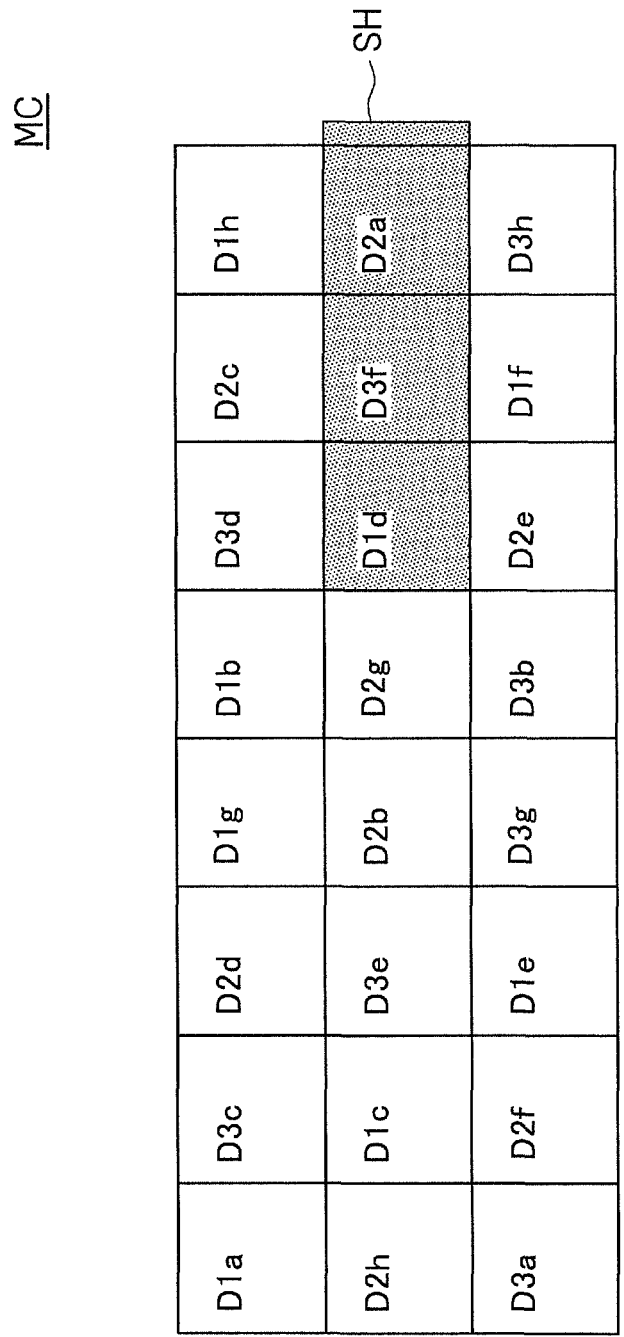
FIG. 6 is a pattern diagram schematically illustrating a layout pattern of the photovoltaic module illustrated in FIG. 5 and an assumed shade.

FIG. 1, FIG. 2, FIG. 7, and FIG. 8 relate to a known photovoltaic module MA. FIG. 3, FIG. 4, FIG. 9, and FIG. 10 relate to a photovoltaic module MB to be applied to the present invention. FIG. 5 and FIG. 6 relate to a photovoltaic module MC to be applied to the present invention. The photovoltaic module MC is a further improvement of the photovoltaic module MB.

First, by referring to FIG. 1 to FIG. 6, a configuration, operation and effect of the photovoltaic module MB to be applied to the present invention will be described compared with the known photovoltaic module MA. Additionally, a configuration, operation and effect of the photovoltaic module MC to be applied to the present invention will be described compared with the photovoltaic module MB.

Figure 1:
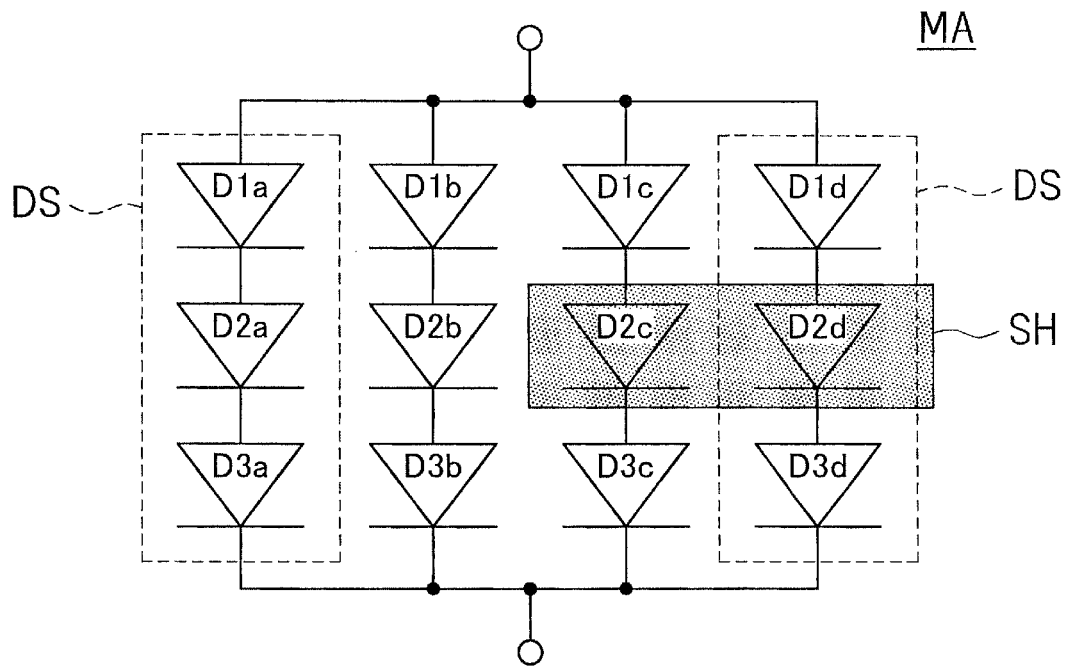
FIG. 1 is an equivalent circuit of a known photovoltaic module illustrating a principle of a photovoltaic module to be applied to the present invention.

FIG. 1 is an equivalent circuit of the known photovoltaic module MA illustrating principles of the photovoltaic module MB and the photovoltaic module MC to be applied to the present invention.

Figure 2:
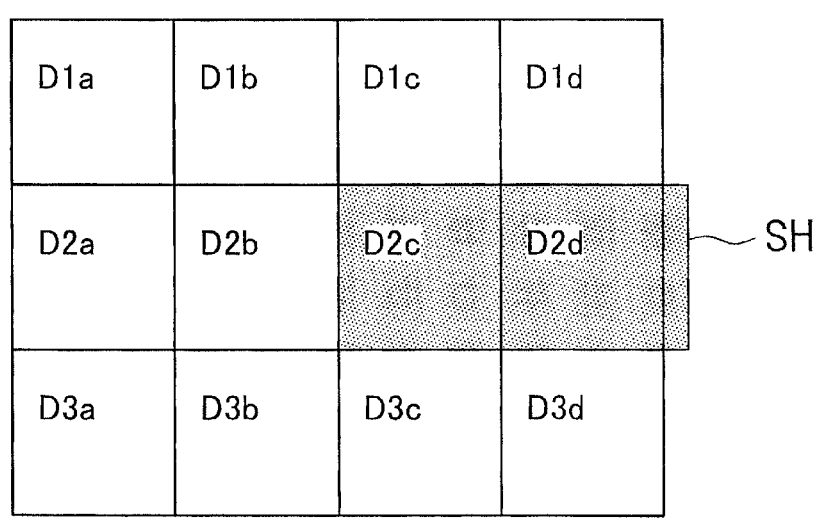
FIG. 2 is a pattern diagram schematically illustrating a layout pattern in the photovoltaic module illustrated in FIG. 1 and an assumed shade.

FIG. 2 is a pattern diagram schematically illustrating a layout pattern in the photovoltaic module MA illustrated in FIG. 1 and an assumed shade SH.

The known photovoltaic module MA includes a series portion DS formed of a plurality (for example, three) of photovoltaic elements D coupled in series (for convenience of explanation, individual reference numerals are given to the respective photovoltaic elements so as to express the elements in forms of D1a, D2a-D3d. Especially, in the case where distinguishing respective photovoltaic elements is unnecessary, these elements may be described simply as photovoltaic elements D. Hereinafter, the same applies to the photovoltaic module MB and the photovoltaic module MC).

The photovoltaic module MA includes a series portion DS constituted by photovoltaic elements D1a, D2a, and D3a, a series portion DS constituted by photovoltaic elements D1b, D2b, and D3b, a series portion DS constituted by photovoltaic elements D1c, D2c, and D3c, and a series portion DS constituted by photovoltaic elements D1d, D2d, D3d. That is, the photovoltaic module MA includes four series portions DS.

Both ends of the four series portions DS are coupled parallel to one another. Accordingly, the photovoltaic module MA includes 12 photovoltaic elements D with three elements in series and four elements in parallel. In the photovoltaic module MA, each series portion DS is electrically insulated and separated from the other series portions DS to form an independent series element group.

The layout pattern of the photovoltaic element D is assumed to be shaded by the shade SH (FIG. 2). That is, the shade SH shades the photovoltaic element D2c and the photovoltaic element D2d. Accordingly, the photovoltaic element D2c and the photovoltaic element D2d are in a non-generation state and do not pass current (In the equivalent circuit of FIG. 1, the shade SH is overlapped.).

Since current does not flow into the photovoltaic element D2c, the series portion DS constituted by the photovoltaic elements D1c, D2c, and D3c cannot generate electric power as a whole even though the photovoltaic elements D1c and D3c are exposed to light. Additionally, since current does not flow into the photovoltaic element D2d, the series portion DS constituted by the photovoltaic elements D1d, D2d, and D3d cannot generate electric power as a whole although the photovoltaic elements D1d and D3d are exposed to light. That is, only two series portions DS on the left side ensure a generation state.

Accordingly, the photovoltaic module MA has a generating area rate (a ratio of an area in generation state, which contributes to effective output, to the whole area) of 6/12 (=0.5=50%) despite an irradiated area rate of 10/12 (=0.83). Power generation efficiency with respect to the area is 50%, which is low.

Figure 3:
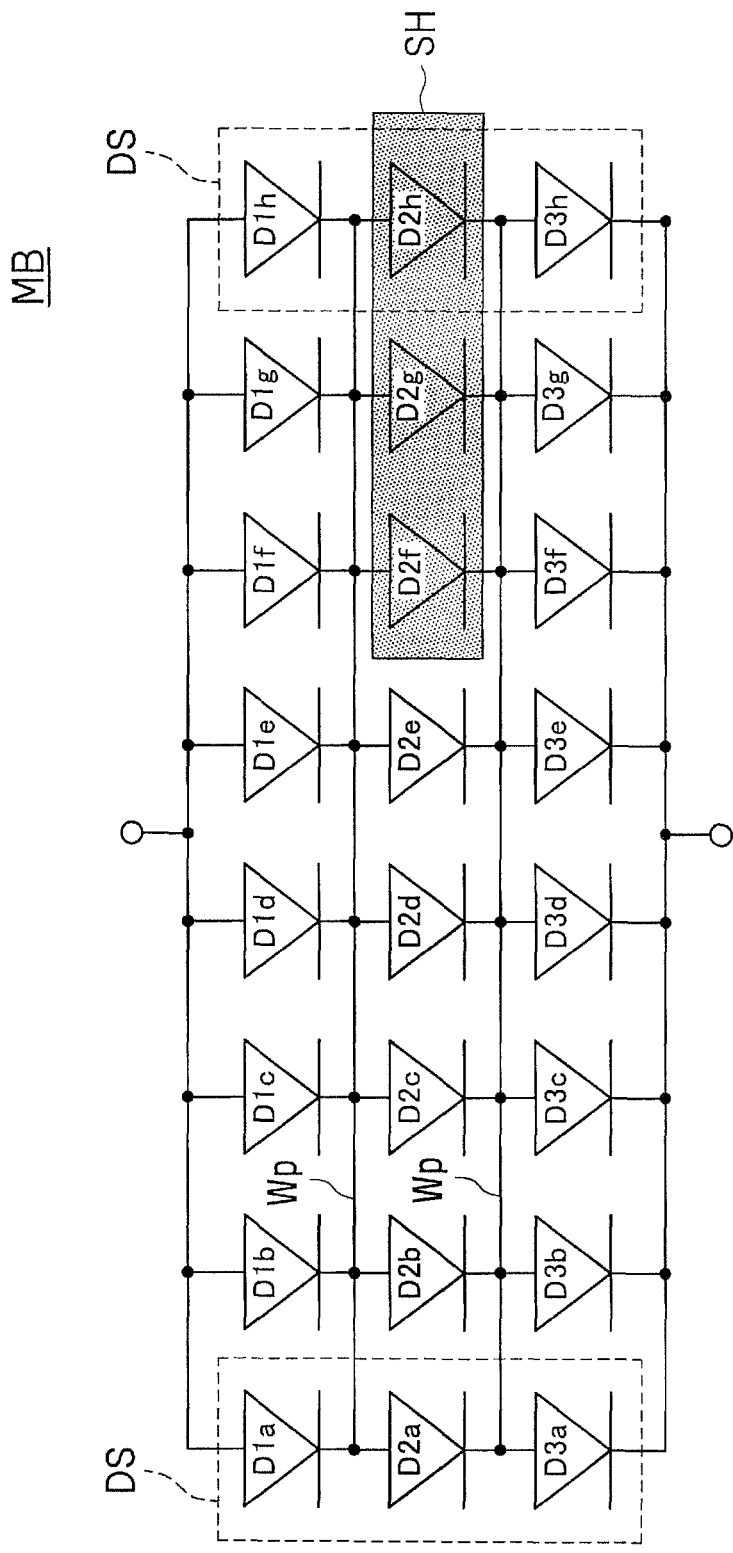
FIG. 3 is an equivalent circuit of a photovoltaic module to be applied to the present invention.

FIG. 3 is an equivalent circuit of a photovoltaic module MB to be applied to the present invention. FIG. 4 is a pattern diagram schematically illustrating a layout pattern in the photovoltaic module MB illustrated in FIG. 3 and the assumed shade SH.

The photovoltaic module MB includes a series portion DS formed of a plurality (for example, three) of photovoltaic elements D coupled in series. That is, similarly to the photovoltaic module MA, the photovoltaic module MB includes a series portion DS constituted by photovoltaic elements D1a, D2a, and D3a, a series portion DS constituted by photovoltaic elements D1b, D2b, and D3b—a series portion DS constituted by photovoltaic elements D1h, D2h, and D3h. That is, the photovoltaic module MB includes eight series portions DS.

Both ends of the eight series portions DS are coupled parallel to one another. Accordingly, the photovoltaic module MB includes 24 photovoltaic elements D with three elements in series and eight elements in parallel.

In the photovoltaic module MB, unlike the photovoltaic module MA, the photovoltaic elements D coupled (arranged) in the same straight row in the respective series portions DS are coupled parallel to one another via parallel wiring Wp. That is, the photovoltaic module MB has a structure where parallel contact points are formed in a row direction in addition to series contact points in the series portion DS in a column direction. The structure includes two-dimensional contact points where contact points are formed in both directions of the row direction and the column direction.

In the case where the whole area of a photo-receiving surface in the photovoltaic module MA and the whole area of a photo-receiving surface in the photovoltaic module MB are the same, the photovoltaic module MB includes twice the number of photovoltaic elements D. This allows the number of photovoltaic elements D in generation state to follow a shape of the shade SH with high accuracy.

Assume that the layout pattern of the photovoltaic elements D is shaded by the shade SH (FIG. 4). That is, the shade SH shades the photovoltaic element D2f, the photovoltaic element D2g, and the photovoltaic element D2h. Accordingly, the photovoltaic element D2f, the photovoltaic element D2g, and the photovoltaic element D2h are in a non-generation state and do not pass current (In the equivalent circuit of FIG. 3, the shade SH is overlapped.).

In the photovoltaic module MA, the shade SH affects two elements of the photovoltaic elements D2c and D2d (which is ½ with respect to four elements of the photovoltaic elements D2a, D2b, D2c, and D2d) (see FIG. 1 and FIG. 2). For example, even in the case where the shade SH affects the entire photovoltaic element D2d and approximately half of the photovoltaic element D2c, the photovoltaic element D2c is also affected. Accordingly, two elements of the photovoltaic elements D2c and D2d are substantially assumed to be affected. In contrast, in the case of the photovoltaic module MB, the following case is assumed. The photovoltaic element D2e is not affected by the shade SH while three elements of the photovoltaic elements D2f, D2g, and D2h are affected by the shade SH.

That is, among eight elements of the photovoltaic elements D2a-D2h, three elements of the photovoltaic elements D2f, D2g, and D2h are affected by the shade SH. This decreases the number of the series portions DS affected by the shade SH to 3/8 (<½). This suppresses the impact of the shade SH and ensures an advantage (an advantage that suppresses the impact of the shade SH) with respect to the known photovoltaic module MA. The entire current is restricted by a straight row where the number of photovoltaic elements D in generation state is smallest among the respective straight rows. That is, the number of the series portions in operation is determined by the minimum number of photovoltaic elements D in a generation state in the respective straight rows.

In the photovoltaic module MB illustrated in FIG. 3 and FIG. 4, the middle row includes the minimum number of the photovoltaic elements D in a generation state. That is, among the photovoltaic elements D2a-D2e, D2f, D2g, and D2h, current flows through the photovoltaic element D2a-D2e (five photovoltaic elements D in the middle row). The entire effective electric generation is controlled by the photovoltaic elements D (with a generating area of 5×3=15) corresponding to five columns and three rows of the photovoltaic elements D2a-D2e. The rate of the generating area to the whole area becomes 15/24.

Accordingly, the photovoltaic module MB has an irradiated area rate of 21/24 (=0.875 that is higher than 0.83 of the photovoltaic module MA), and a generating area rate of 15/24 (=0.625=62.5%), and a power generation efficiency of 62.5% with respect to the whole area. That is, the photovoltaic module MB ensures the generating area rate higher than that of the photovoltaic module MA, and improves power extraction efficiency to ensure high power generation efficiency. The advantage of the photovoltaic module MB according to the present invention with respect to the known photovoltaic module MA will be described by additionally applying concrete examples in FIG. 7 to FIG. 10.

FIG. 5 is an equivalent circuit of a photovoltaic module MC to be applied to the present invention. FIG. 6 is a pattern diagram schematically illustrating a layout pattern of the photovoltaic module MC illustrated in FIG. 5 and an assumed shade SH.

The photovoltaic module MC is a further improvement of the photovoltaic module MB. Accordingly, differences will mainly be described.

The photovoltaic module MC includes a series portion DS formed of a plurality (for example, three) of photovoltaic elements D coupled in series. The photovoltaic elements D coupled (arranged) in the same straight row in the respective series portions DS are coupled parallel to one another via parallel wiring Wp as a coupling form with two-dimensional contact points. Additionally, the photovoltaic module MC includes the photovoltaic elements D with an arrangement (a layout pattern) that is an arrangement different from an arrangement in an equivalent circuit (that is, in a state of a distributed arrangement where the elements are randomly and decentrally arranged) in addition to the coupling form with the two-dimensional contact points.

In the case where the photovoltaic elements D are randomly and decentrally arranged, the photovoltaic elements D are arranged in the upper row in the equivalent circuit while the photovoltaic elements D are decentrally arranged in any of the upper row, the middle row, and the lower row in the layout pattern. Additionally, the photovoltaic elements D are arranged in the same straight row in the equivalent circuit, while the photovoltaic elements D in the layout pattern are decentrally arranged in different lateral positions from those in the equivalent circuit.

The inventors refer to the form (the photovoltaic module MC) including the coupling form (the photovoltaic module MB and the photovoltaic module MC) with the two-dimensional contact points and the architecture where the arrangement (the layout pattern) of the photovoltaic elements is an arrangement different from the arrangement in the equivalent circuit as "distributed arrangement architecture." With this distributed arrangement, even in the case where the shade SH concentrates on the layout, the shade SH is decentrally arranged on the equivalent circuit. This suppresses the impact of the shade SH on the series portion DS where the elements are coupled in series.

The photovoltaic module MC is as illustrated in the equivalent circuit. In the upper row, the photovoltaic element D1$a$, the photovoltaic element D2$b$—the photovoltaic element D1$h$ are coupled in parallel. In the middle row, the photovoltaic element D2$a$, the photovoltaic element D2$b$—the photovoltaic element D2$h$ are coupled in parallel. In the lower row, the photovoltaic element D3$a$, the photovoltaic element D3$b$—the photovoltaic element D3$h$ are arranged. The coupling condition of the equivalent circuit is similar to that of the photovoltaic module MB.

The coupling conditions of the photovoltaic elements D in the equivalent circuit of the photovoltaic module MB and in the equivalent circuit of the photovoltaic module MC are the same. In contrast, in the layout pattern of the photovoltaic module MC is as illustrated in FIG. 6. On the layout, in the upper row, the photovoltaic element D1$a$, the photovoltaic element D3$c$—the photovoltaic element D2$c$, and the photovoltaic element D1$h$ are arranged from left to right in this order. In the middle row, the photovoltaic element D2$h$, the photovoltaic element D1$c$—the photovoltaic element D3$f$, and the photovoltaic element D2$a$ are arranged from left to right in this order. In the lower row, the photovoltaic element D3$a$, the photovoltaic element D2$f$—the photovoltaic element D1$f$, and the photovoltaic element D3$h$ are arranged from left to right in this order.

That is, the photovoltaic elements D are arranged such that the layout pattern has a different arrangement from the arrangement on the equivalent circuit. The layout pattern (FIG. 6) is an example, and another layout pattern may be employed.

Assume that the shade SH shades the layout pattern of the photovoltaic elements D (FIG. 6). That is, the shade SH provides concentrated shades on the right edge of the middle row. That is, the shade SH shades the photovoltaic element D1$d$, the photovoltaic element D3$f$, and the photovoltaic element D2$a$. Accordingly, the photovoltaic element D1$d$, the photovoltaic element D3$f$, and the photovoltaic element D2$a$ are in a non-generation state and do not pass current (In the equivalent circuit of FIG. 5, the shade SH is overlapped.).

In the state where the shade SH concentrates and shades the photovoltaic element D1$d$, the photovoltaic element D3$f$, and the photovoltaic element D2$a$, in the equivalent circuit, the photovoltaic element D1$d$ is arranged in the fourth position from the left in the upper row, the photovoltaic element D2$a$ is arranged at the left end in the middle row, and the photovoltaic element D3$f$ is arranged in the third position from the right in the lower row. Thus, these elements are decentrally arranged. That is, in each straight rows (each of the upper row, the middle row, and the lower row), there is only one photovoltaic element D in non-generation state. The current restriction in series portions DS is limited to a current restriction of one series portion DS.

Accordingly, in each straight row, only one photovoltaic element D (the photovoltaic element D1$d$ in the upper row, the photovoltaic element D2$a$ in the middle row, and the photovoltaic element D3$f$ in the lower row) is in non-generation state and restricts the entire current. Substantially, the coupling condition that is not affected by the shade SH becomes 3 (three elements in series)×7 (seven elements in parallel) in the equivalent circuit, and suppresses decrease in power transmission efficiency on the current path.

That is, the photovoltaic module MC has the irradiated area rate of 21/24 (=0.875 that is the same as that of the photovoltaic module MB.), the generating area rate of 21/24 (=0.875=87.5%), and the power generation efficiency of 87.5% with respect to the whole area.

That is, the photovoltaic module MC according to the present invention ensures a large generating area rate even in the case where the irradiated area rate is the same as that of the photovoltaic module MB according to the present invention, and suppresses decrease in power transmission efficiency. This improves the power extraction efficiency, thus ensuring high power generation efficiency as a whole. In the photovoltaic module MC, the irradiated area rate and the generating area rate are the same. This allows electric generation depending on sunshine and maintains high power generation efficiency.

Next, advantageous effects of the photovoltaic module MB according to the present invention with respect to the known photovoltaic module MA will be further described. Here, the advantages of the photovoltaic module MC with respect to the photovoltaic module MB according to the present invention are as described above. Therefore, an additional explanation will not be further elaborated.

Figure 7:
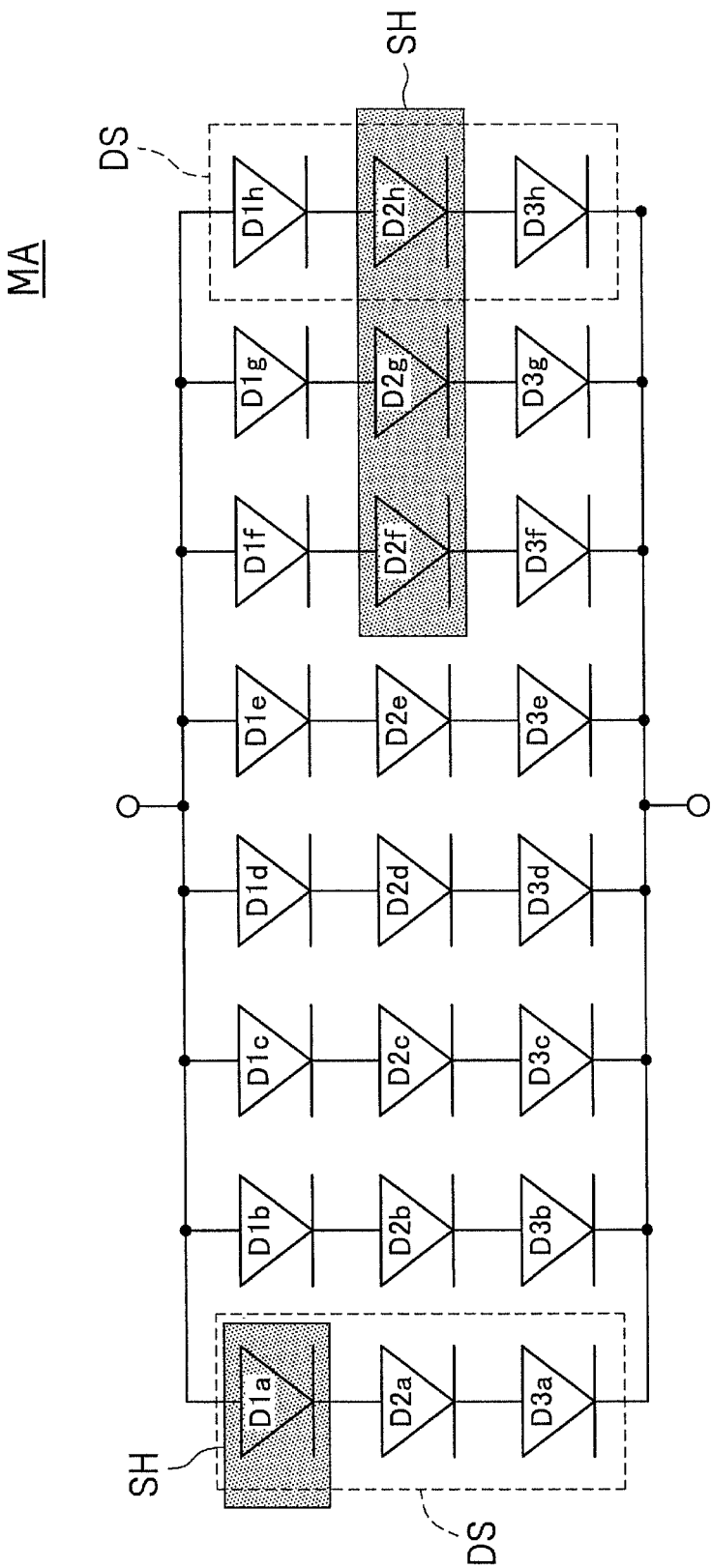
FIG. 7 is an equivalent circuit of the known photovoltaic module in another embodiment.
Figure 8:
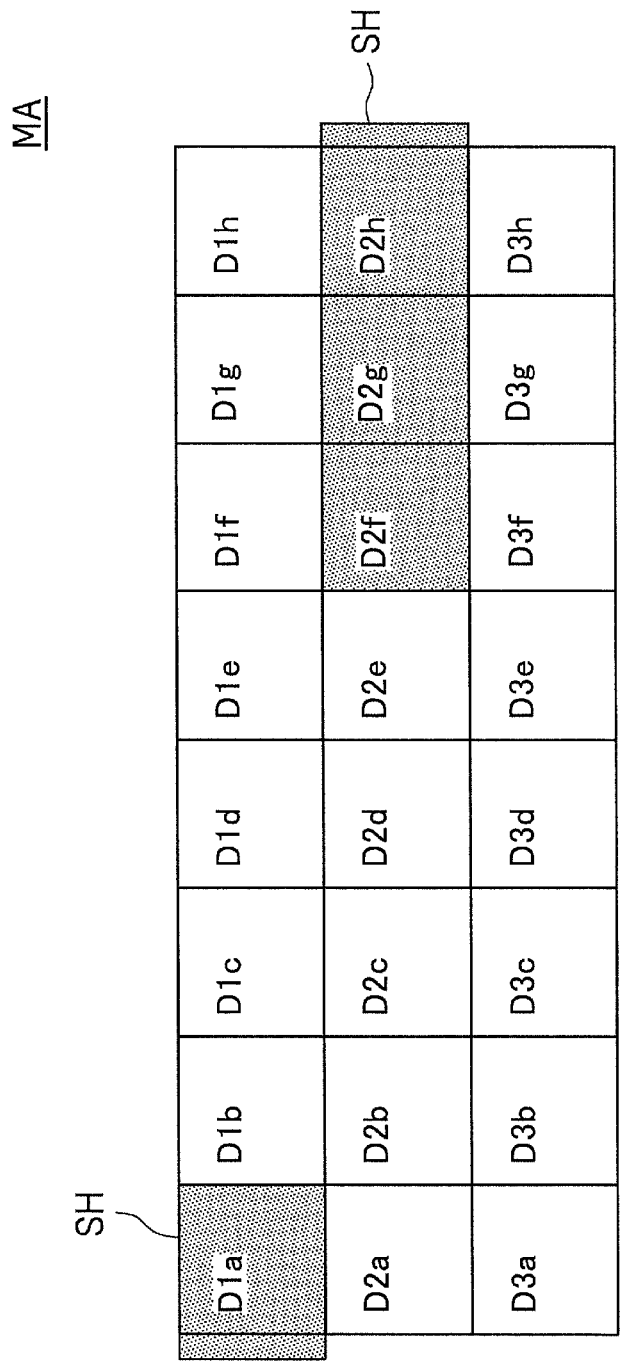
FIG. 8 is a pattern diagram schematically illustrating a layout pattern of the photovoltaic module illustrated in FIG. 7 and an assumed shade SH.

FIG. 7 is an equivalent circuit of the known photovoltaic module MA in another embodiment. FIG. 8 is a pattern diagram schematically illustrating a layout pattern of the photovoltaic module MA illustrated in FIG. 7 and an assumed shade SH.

The photovoltaic module MA includes, for ease of comparison, three elements in series and eight elements in parallel similarly to the photovoltaic module MB. Assume that the shade SH shades the photovoltaic element D1$a$ arranged in the upper row of the series portion DS, and the photovoltaic element D2$f$, the photovoltaic element D2$g$, and the photovoltaic element D2$h$ that are arranged in the middle row (FIG. 8).

By the impact of the shade SH, the series portion DS coupled to the photovoltaic element D1$a$, the series portion DS coupled to the photovoltaic element D2$f$, the series portion DS coupled to the photovoltaic element D2$g$, and the series portion DS coupled to the photovoltaic element D2$h$ are in a non-generation state.

That is, the series portions DS that ensure a generation state are only four series portions DS coupled to the photovoltaic element D1b, the photovoltaic element D1c, the photovoltaic element D1d, and the photovoltaic element D1e.

Accordingly, the photovoltaic module MA has a generating area rate (a ratio of area in a generation state, which allows output, to the whole area) of 12/24 (=0.5=50%) despite an irradiated area rate of 20/24 (=0.83) and has a power generation efficiency of 50% with respect to the area.

Figure 9:
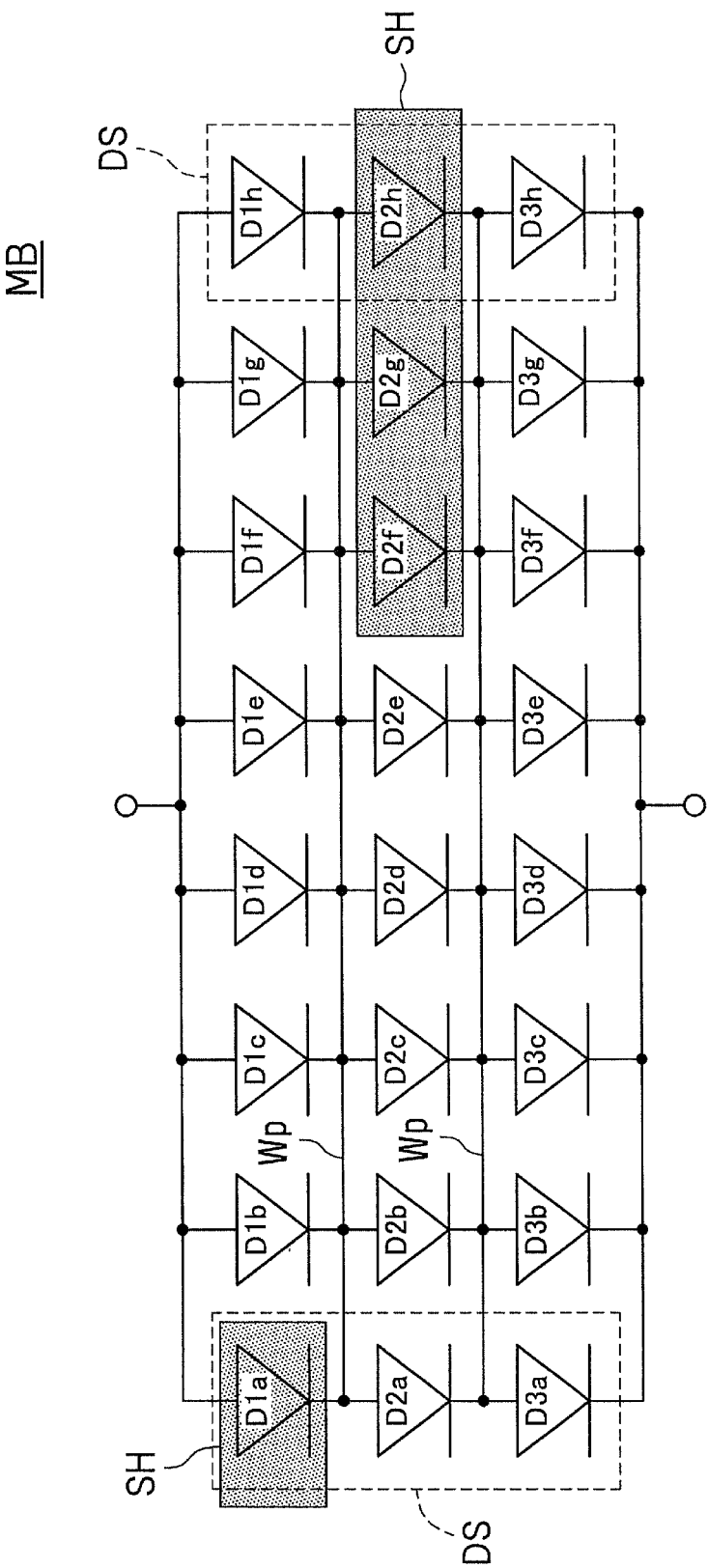
FIG. 9 is an equivalent circuit of a photovoltaic module to be applied to the present invention.
Figure 10:
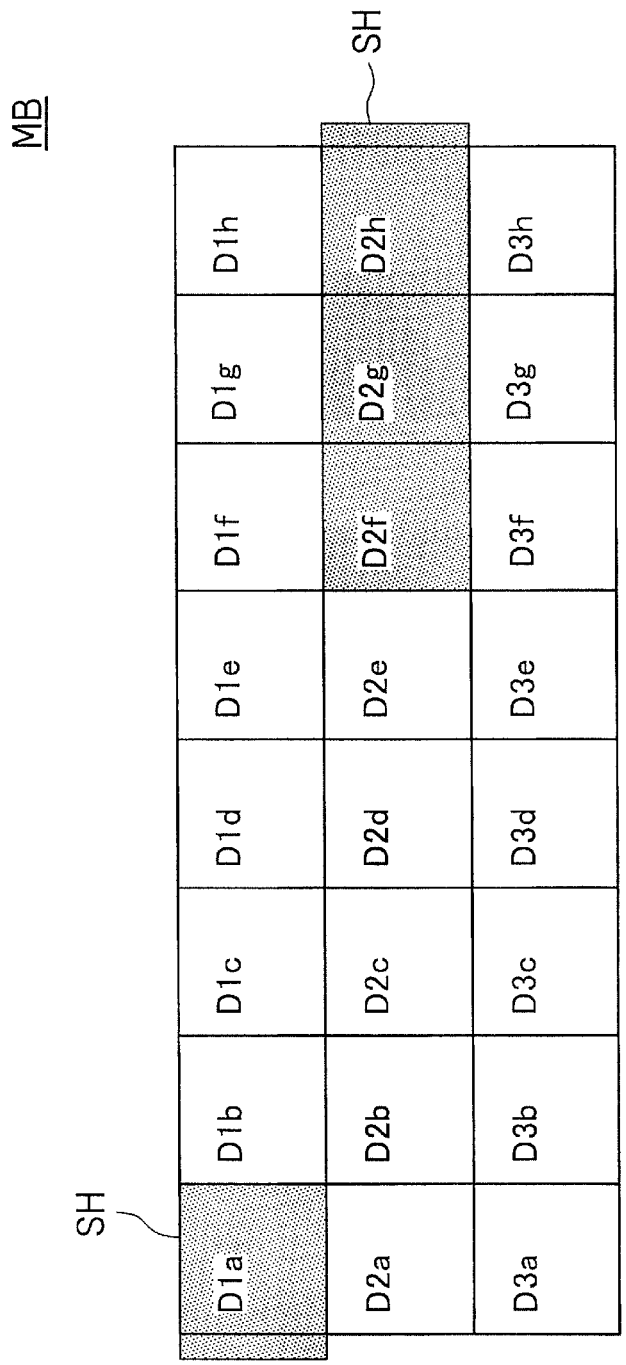
FIG. 10 is a pattern diagram schematically illustrating a layout pattern of the photovoltaic module illustrated in FIG. 9 and an assumed shade.

FIG. 9 is an equivalent circuit of a photovoltaic module MB to be applied to the present invention. FIG. 10 is a pattern diagram schematically illustrating a layout pattern of the photovoltaic module MB illustrated in FIG. 9 and an assumed shade SH.

The photovoltaic module MB illustrated in FIG. 9 is different only in the state of the shade SH, and otherwise similar to the photovoltaic module MB illustrated in FIG. 3.

Regarding the shade SH, assume that the shade SH shades, similarly to the case in FIG. 8, the photovoltaic element D1a arranged in the upper row of the series portion DS, and the photovoltaic element D2f, the photovoltaic element D2g, and the photovoltaic element D2h that are arranged in the middle row (FIG. 10).

By the impact of the shade SH, the photovoltaic element D1a, the photovoltaic element D2f, the photovoltaic element D2g, and the photovoltaic element D2h are in a non-generation state. That is, in the upper row, seven elements among the eight photovoltaic elements D ensure a generation state. In the middle row, five elements among the eight photovoltaic elements D ensure a generation state. In the lower row, eight elements among the eight elements ensure a generation state.

As described in FIG. 3 and FIG. 4, the entire current is restricted by the straight row where the number of the photovoltaic elements D in generation state among the respective straight rows is smallest. Accordingly, in the middle row, the entire current is restricted by the five elements (five columns) in generation state among the eight elements. Substantially, five columns (3 rows×5 columns=15 photovoltaic elements D) are generation state. A ratio of generating area to the whole area becomes 15/24.

Accordingly, the photovoltaic module MB has an irradiated area rate of 20/24 (=0.83), a generating area rate (a ratio of area in a generation state, which allows output, to the whole area) of 15/24 (=0.625=62.5%), and a power generation efficiency of 62.5% with respect to the area.

That is, in the case where both the photovoltaic module MA and the photovoltaic module MB have the same irradiated area rate (20/24 (=0.83)), the photovoltaic module MB has the generating area rate of 62.5% while the photovoltaic module MA has the generating area rate of 50%. Accordingly, the photovoltaic module MB improves the power transmission efficiency to avoid an impact of the shade SH in practical usage, and significantly improves the generating area rate to improve the power extraction efficiency, compared with the photovoltaic module MA.

Here, as described above, the photovoltaic module MC compared with the photovoltaic module MB has higher power extraction efficiency.

(Embodiment 1)

By referring to FIG. 11 to FIG. 16, a description will be given of a photovoltaic module 10 included in a photovoltaic apparatus 1 (see Embodiment 2) according to the present invention as Embodiment 1.

Figure 11:
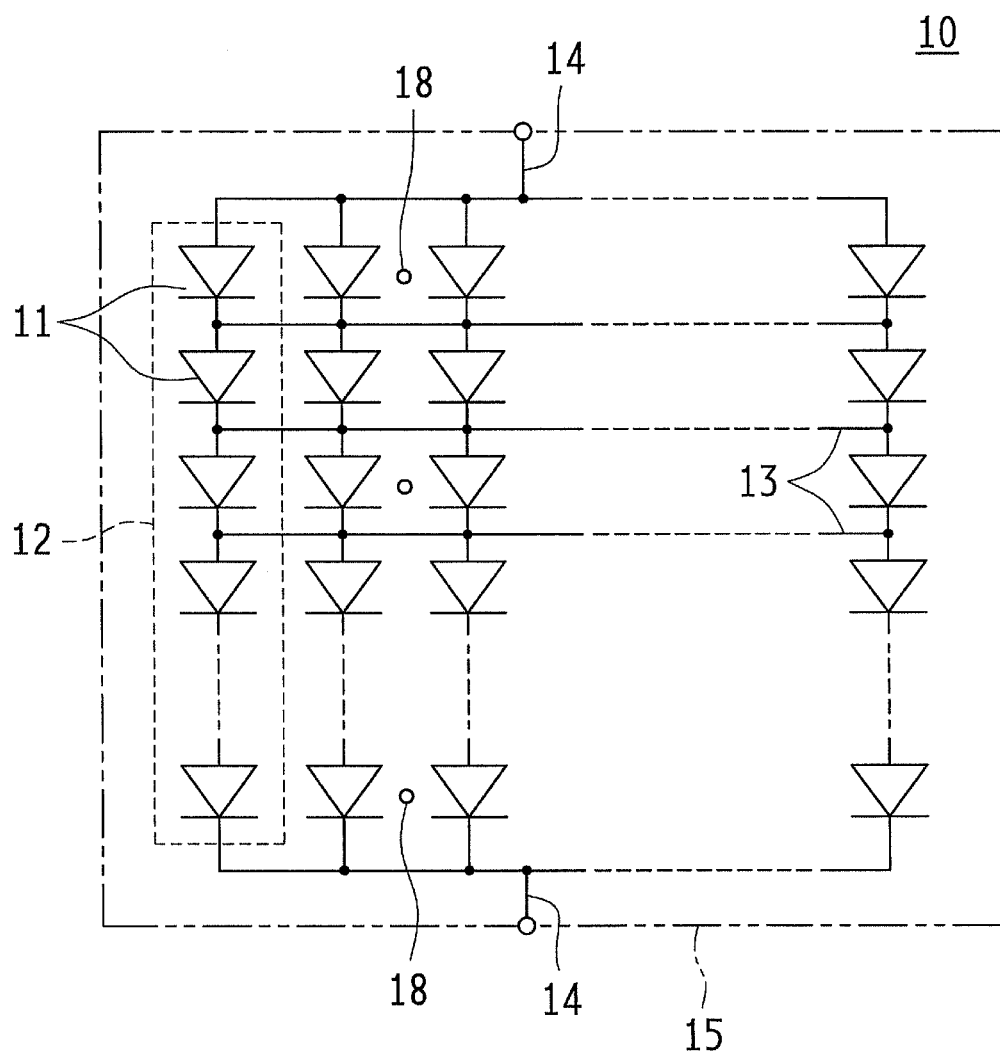
FIG. 11 is a pattern diagram illustrating a coupling condition of photovoltaic elements in a photovoltaic module to be applied to Embodiment 1 of the present invention.

FIG. 11 is a pattern diagram illustrating a coupling condition of a photovoltaic element 11 in the photovoltaic module 10 applied to Embodiment 1 of the present invention.

In the photovoltaic module 10, a plurality of series portions 12 are coupled in parallel. The series portion 12 includes a plurality of photovoltaic elements 11 coupled in series. In the plurality of the series portions 12, the respective photovoltaic elements 11 coupled in the same straight row are coupled in parallel.

The photovoltaic module 10 is preferred to employ a distributed arrangement where a layout pattern of the photovoltaic elements 11 is different from the arrangement in the equivalent circuit. With this configuration, the photovoltaic module 10 employs a distributed arrangement as the layout pattern of the photovoltaic elements 11 that constitute the photovoltaic module 10, so as to suppress the impact of shade on the series portion 12 where the photovoltaic elements 11 are coupled in series. This suppresses a decrease in power transmission efficiency, thus improving power extraction efficiency.

That is, the photovoltaic module 10 is preferred to have a configuration similar to the photovoltaic module MB as described in the column of "Configuration, and operation and effect of a photovoltaic module to be applied to the present invention", or to the photovoltaic module MC.

In the series portion 12, the respective photovoltaic elements 11 coupled in the same straight row are coupled in parallel by parallel coupling lines 13. The photovoltaic elements 11 coupled in series and in parallel are modularized by a mounting portion 15 in a single mounting form as a whole. The photovoltaic module 10 includes a pair of output lines 14 as an external output unit. One output line 14 is assigned to a positive side while the other output line 14 is assigned to a negative side.

The inventors have discovered the following fact during examination for a countermeasure to shade in a solar cell module (the photovoltaic module 10). Compared with the form where the series portions 12 with the photovoltaic elements 11 coupled in series are coupled in parallel only at both ends of the series portions 12, the arrangement form where the respective photovoltaic elements 11 in the same straight row are coupled in parallel provides extremely advantageous characteristics for occurrence of shade (see FIG. 12 and the latter drawings). To more clearly describe the coupling condition and the arrangement of the photovoltaic module 10 that provides advantageous characteristics as the countermeasure for shade, the present inventors express the coupling form of the photovoltaic module 10 as "distributed arrangement architecture."

For example, a total of 640 photovoltaic elements 11 are arranged with 40 elements in series×16 elements in parallel. The photovoltaic element 11 is, for example, a solar battery cell formed on a silicon substrate or similar substrate. The solar battery cell formed on the silicon substrate in a crystal system has an open circuit voltage of about 0.6 V in a normal operating state. Accordingly, if one photovoltaic element 11 provides an output voltage of about 0.5 V (volts), 40 elements in series provides an output (voltage) of about 20 V. That is, regarding the photovoltaic elements 11, the number of elements in series and the number of elements in parallel are set corresponding to an output voltage to be requested. Output current increases proportionate to the number of elements in parallel.

The mounting portion 15 typically includes, at its front surface side, a singular translucent substrate (of a transparent material in a planar shape or a curved surface shape) where the photovoltaic elements 11 are arranged at its inner side. The photovoltaic element 11 is, at a back surface side, protected by sealing material to ensure weather resistance and mechanical strength.

The photovoltaic module 10 (the mounting portion 15) according to this embodiment includes a temperature sensor 18 in addition to the photovoltaic element 11. The temperature sensor 18 has a configuration that obtains a temperature (a panel temperature Tp) when the photovoltaic module 10 is operating. The temperature sensor 18 is arranged, for example, at a gap between the photovoltaic elements 11, and is preliminarily arranged to accurately obtain an actual temperature of the photovoltaic element 11.

Regarding the temperature sensor 18, it is preferred that a plurality of the temperature sensors 18 be evenly arranged as much as possible with respect to the whole surface area of the mounting portion 15. Regarding the temperature sensor 18, it is preferred that a position where the temperature sensor 18 indicates a temperature close to an average value among the temperatures in the respective positions in the photovoltaic module 10 be preliminarily selected and the temperature sensor 18 be disposed at the position. The temperature sensor 18 is preferred to be arranged to directly reflect an actual temperature of the photovoltaic element 11, for example, arranged under the same condition as that of the photovoltaic element 11 with respect to an irradiation light such as sunlight.

If the photovoltaic element 11 is resin-sealed, the temperature sensor 18 is preferred to be resin-sealed similarly to the photovoltaic element 11. The temperature sensor 18 measures (detects) a temperature in a state where the temperature sensor 18 is mounted close to the photovoltaic element 11 and similarly to the photovoltaic element 11. This allows accurate measurement of temperature (the panel temperature Tp) of the photovoltaic module 10 (the photovoltaic element 11).

The temperature sensor 18 is constituted by, for example, a thermistor. The thermistor outputs a temperature as an electrical signal, and has good consistency with the temperature range when a solar battery cell or similar element to be applied as the photovoltaic element 11 is operating. Accordingly, a highly accurate temperature is detected, thus providing high reliability. The temperature sensor 18 employs a thermocouple and similar element other than the thermistor.

Figure 12:
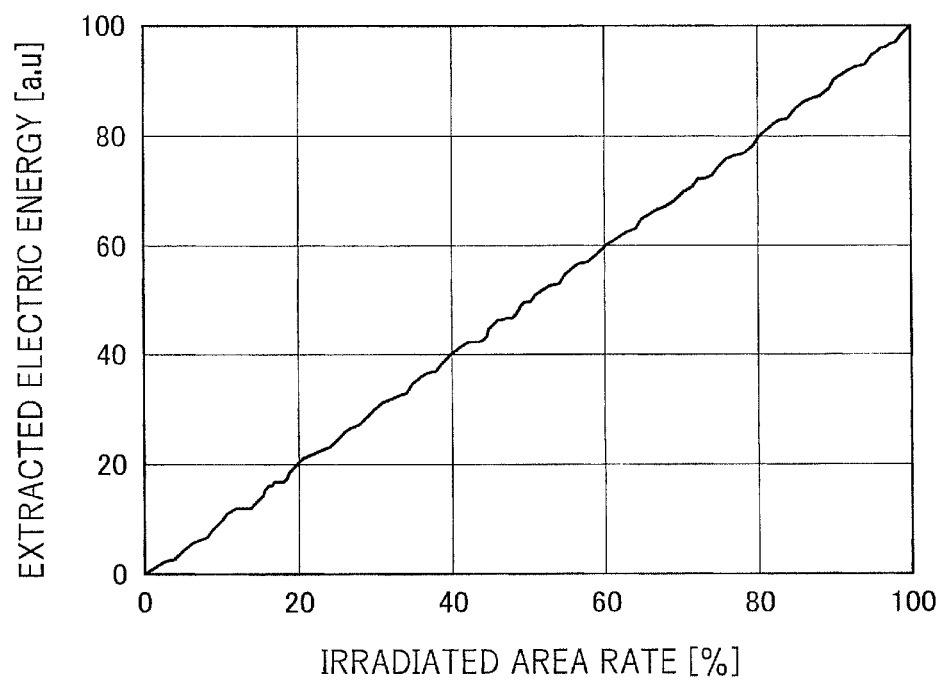
FIG. 12 is a characteristic graph illustrating a relationship of extracted electric energy to an irradiated area rate in the photovoltaic module illustrated FIG. 11.

FIG. 12 is a characteristic graph illustrating a relationship of extracted electric energy to irradiated area rate in the photovoltaic module 10 illustrated FIG. 11

In FIG. 12, the horizontal axis denotes irradiated area rate (%) and the vertical axis denotes extracted electric energy (a.u.: any unit). The extracted electric energy of 100 (a.u.) corresponds to, for example, the rated power (or maximum electric power). Change in irradiated area rate corresponds to, in other words, what is called change in shade.

The inventors have newly confirmed the following fact during various examinations. The photovoltaic module 10 that employs the distributed arrangement architecture shows a characteristic completely different from that of the known photovoltaic module. That is, the photovoltaic module 10 according to the embodiment provides an output (the extracted electric energy) approximately proportionate to the irradiated area rate. Accordingly, the photovoltaic module 10 consistently prevents extreme decreases in output even in a state where shade occurs, and ensures output corresponding to the irradiated area rate.

Figure 13:
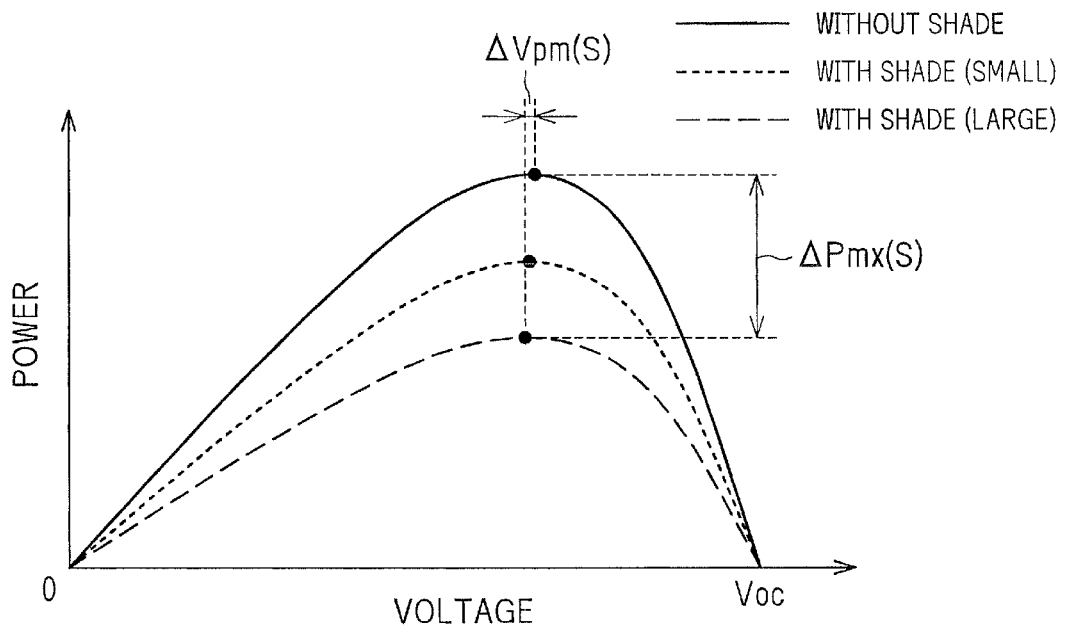
FIG. 13 is a graph of an output characteristic illustrating variation in output with respect to an output characteristic (a power-voltage characteristic) of the photovoltaic module illustrated in FIG. 11 in the case where a shaded condition is used as a parameter.

FIG. 13 is a graph of an output characteristic illustrating variation in output with respect to an output characteristic (a power-voltage characteristic) of the photovoltaic module 10 illustrated in FIG. 11 in the case where a shaded condition is used as a parameter.

In FIG. 13, the horizontal axis denotes voltage obtained from the output line 14 of the photovoltaic module 10, and the vertical axis denotes output (electric power) of the photovoltaic module 10 obtained by multiplication of voltage of the output line 14 and current flowing into the output line 14. That is, the output characteristic (the power-voltage characteristic) of the photovoltaic module 10 is illustrated as a curved line in a bell shape (a half-wave waveform) with a single peak from a voltage of zero to an open circuit voltage Voc. Temperature (the panel temperature Tp) is assumed to be constant.

The shaded conditions are classified into three parameters and shown. Under a condition without shade, the relative maximum output is obtained among the three conditions. Under the condition with shade (large), the relative smallest output is obtained among the three conditions. Under condition with shade (small), the intermediate output is obtained among the three conditions. In cases under the three shaded conditions, a difference between respective outputs at the maximum power points, that is, an output difference between the output (without shade) and output (with shade (large)) is ΔPmx (S). A variation in output corresponding to the shaded condition is observed.

With respect to the variation in output (ΔPmx (S)), a difference between voltages (the maximum power operating voltage) (ΔVpm (S)) corresponding to the maximum power points rarely occurs. This shows the advantageous effect where the photovoltaic module 10 receives little impact of shade (FIG. 12).

Figure 14:
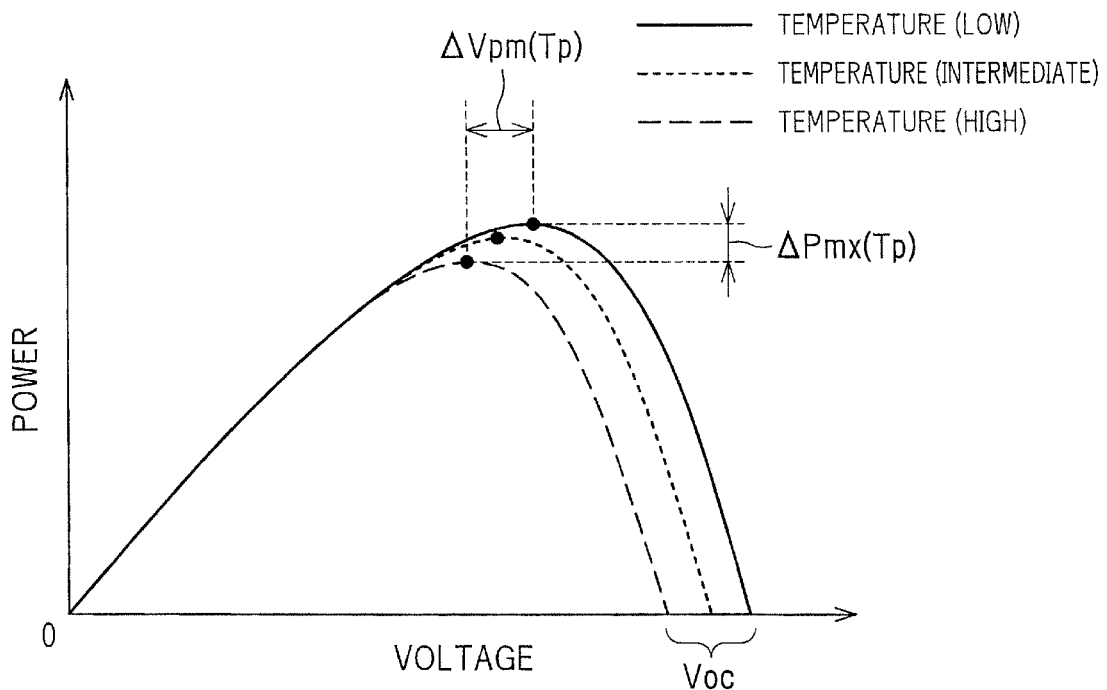
FIG. 14 is a characteristic graph illustrating variation in output with respect to the output characteristic (the power-voltage characteristic) of the photovoltaic module illustrated in FIG. 11 in the case where a temperature condition is used as a parameter.

FIG. 14 is a characteristic graph illustrating variation in output with respect to the output characteristic (the power-voltage characteristic) of the photovoltaic module 10 illustrated in FIG. 11 in the case where a temperature condition is used as a parameter.

In FIG. 14, the horizontal axis denotes voltage obtained from the output line 14 of the photovoltaic module 10, and the vertical axis denotes output (electric power) of the photovoltaic module 10 obtained by multiplication of voltage of the output line 14 and current flowing into the output line 14. That is, the output characteristic (the power-voltage characteristic) of the photovoltaic module 10 is illustrated as a curved line in a bell shape (a half-wave waveform) with a single peak from a voltage of zero to an open circuit voltage Voc. Lighting intensity (existence of the shade) is assumed to be constant.

The temperature conditions (the panel temperature Tp) are classified into three parameters. Under a low temperature condition (temperature (low)), the relatively maximum output is obtained among the three conditions. Under a high temperature condition (temperature (high)), the relatively smallest output is obtained among the three conditions. Under an intermediate temperature condition (temperature (intermediate)), the relatively intermediate output is obtained among the three conditions. In cases under the three temperature conditions, a difference between respective outputs at the maximum power points, that is, a difference between the output (temperature (low)) and output (temperature (high)) is ΔPmx (Tp). The output is varied corresponding to the temperature condition. That is, a lower temperature provides a higher output.

With respect to the variation in output (ΔPmx (Tp)), a difference between voltages (the maximum power operating voltage) (ΔVpm (Tp)) corresponding to the maximum power points rarely occurs. However, the distribution has the regularity of a magnitude relationship within a certain range. That is, in the case where a temperature is low, the maximum power operating voltage becomes relatively high. The high temperature provides a relatively low maximum power operating voltage. The open circuit voltage Voc varies slightly corresponding to high and low of the temperature. That is, in a state at high temperature, the open circuit voltage Voc becomes low compared with a state at low temperature.

Figure 19:
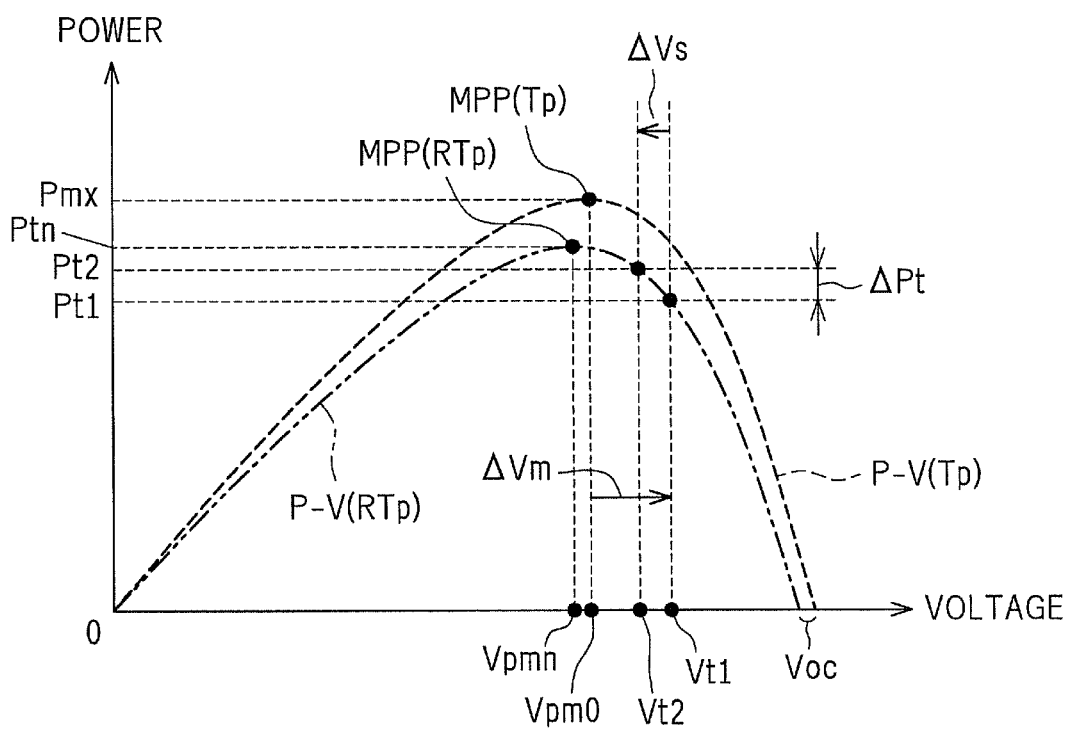
FIG. 19 is a graph illustrating a state of a maximum power point tracking control in the tracking control device that constitutes the main portion of the photovoltaic apparatus illustrated in FIG. 17.

Accordingly, detecting a real temperature (a real panel temperature RTp) of the photovoltaic module 10 allows relative comparison of an output characteristic P-V (RTp) (see FIG. 19) approximated by an output characteristic (the virtual output characteristic P-V (Tp), see FIG. 19) at a preliminarily obtained panel temperature Tp. That is, in the case where an MPPT control is performed (the maximum power point tracking is performed) on the real output characteristic P-V (RTp) of the photovoltaic module 10, this allows an MPPT control of the real panel temperature RTp using the virtual output characteristic P-V (Tp) (the details will be described in Embodiment 2).

FIG. 15 is a data table illustrating an example where data is obtained as a panel temperature-output correlation characteristic with respect to the output characteristic illustrated in FIG. 14 to make the listed data.

In FIG. 15, the column denotes panel temperature Tp (° C.) and the row denotes MPP (maximum power point) data that includes the maximum output (Pmx) obtained from the photovoltaic module 10 and the maximum power operating voltage (Vpm) at the maximum output (Pmx).

The panel temperature Tp varies depending on a position of the photovoltaic module 10 to be arranged. Here, as a possible temperature usually generated in a natural environment where, for example, the photovoltaic module 10 is arranged and sunlight is irradiated, for example, the MPP data for 0° C. to 25° C. to 50° C. to 75° C. and so on is obtained as listed data.

If a value of the maximum power operating voltage Vpm corresponding to the maximum output Pmx with respect to the panel temperature Tp is obtained, the MPPT control in the photovoltaic apparatus 1 described in Embodiment 2 can be performed on the photovoltaic module 10.

Hereinafter, a relationship between three portions of data (the panel temperature Tp, the maximum output Pmx, and the maximum power operating voltage Vpm) may be expressed as a (virtual) panel temperature-output correlation characteristic P-V (Tp) (see FIG. 19). For the sake of simplification, the panel temperature-output correlation characteristic P-V (Tp) may be described simply as an output characteristic P-V (Tp). Additionally, in the case of the real panel temperature RTp, it may be described as a panel temperature-output correlation characteristic P-V (RTp) or an output characteristic P-V (RTp).

While in FIG. 15 the data is exemplarily illustrated at intervals of 25° C., any temperature interval can be set and is preferred to be set considering accuracy of the MPPT control, search speed to be requested, and similar parameter.

In the case where the panel temperature Tp=0° C., the maximum output Pmx of a maximum output Pmx (0) and the maximum power operating voltage Vpm of a maximum power operating voltage Vpm (0) are used to obtain data. Hereinafter, similarly, for example, in the case where the panel temperature Tp=75° C., the maximum output Pmx (75) and the maximum power operating voltage Vpm (75) are used to obtain data.

As the output characteristic illustrated in FIG. 14, a relationship between the output characteristic (the power-voltage characteristic: P-V characteristic) and the temperature (the panel temperature Tp) in the photovoltaic module 10 has definite regularity. Accordingly, the listed data in FIG. 15 is data where the MPP data in the output characteristic with respect to the panel temperature Tp, that is, the panel temperature-output correlation characteristic is preliminarily obtained as a list and modeled.

Lighting intensity when the listed data in FIG. 15 is obtained is preferred to be the maximum lighting intensity (assumed lighting intensity) assumed under a condition where, for example, the photovoltaic module 10 is assumed to operate. That is, in general usage, since lighting intensity of a light irradiated to the photovoltaic module 10 takes a value smaller than the assumed lighting intensity, the photovoltaic module 10 has an output state in numerical value smaller than the maximum output Pmx and the maximum power operating voltage Vpm illustrated in FIG. 15.

That is, using the listed data illustrated in FIG. 15 allows simple and highly accurate MPPT control of the photovoltaic module 10. The listed data illustrated in FIG. 15 is registered as any data code in a storage unit 23 (see FIG. 11) described in Embodiment 2, and is read out to be used when the MPPT control is performed. Details such as utilization of the MPP data will be described in Embodiment 2.

FIG. 16 is a data table illustrating a modification of the panel temperature-output correlation characteristic where data is obtained as a panel temperature-output correlation characteristic with respect to the output characteristic illustrated in FIG. 14 to make listed data.

A basic configuration of the modification of the panel temperature-output correlation characteristic is similar to the panel temperature-output correlation characteristic (the data table) illustrated in FIG. 15. Accordingly, the main difference will be described.

It is known that the maximum power operating voltage Vpm is approximated by q×Voc where a unique element constant q (here, q<1) determined by physicality (material and crystalline) of the photovoltaic element (the solar battery cell) is multiplied by the open circuit voltage Voc. For example, it is known that q=0.8 in the case of crystal silicon solar cell and q=0.66 in the case of amorphous silicon solar cell.

Accordingly, the open circuit voltage Voc is preliminarily stored corresponding to the panel temperature Tp as data. An open circuit voltage Voc corresponding to a measured panel temperature Tp is employed to calculate a search start voltage Vt1 (see FIG. 19). The formula for computation will be described in detail in Embodiment 2.

(Embodiment 2)

By referring to FIG. 17 to FIG. 19, descriptions will be given of the photovoltaic apparatus 1 according to this embodiment, a maximum power point tracking control method in the photovoltaic apparatus 1, and a computer program that makes a computer execute the maximum power point tracking control in the photovoltaic apparatus 1. Here, the photovoltaic module 10 included in the photovoltaic apparatus 1 is the photovoltaic module 10 described in Embodiment 1.

FIG. 17 is a block diagram illustrating an overall configuration of the photovoltaic apparatus 1 according to Embodiment 2 of the present invention mainly using functional blocks.

Figure 18:
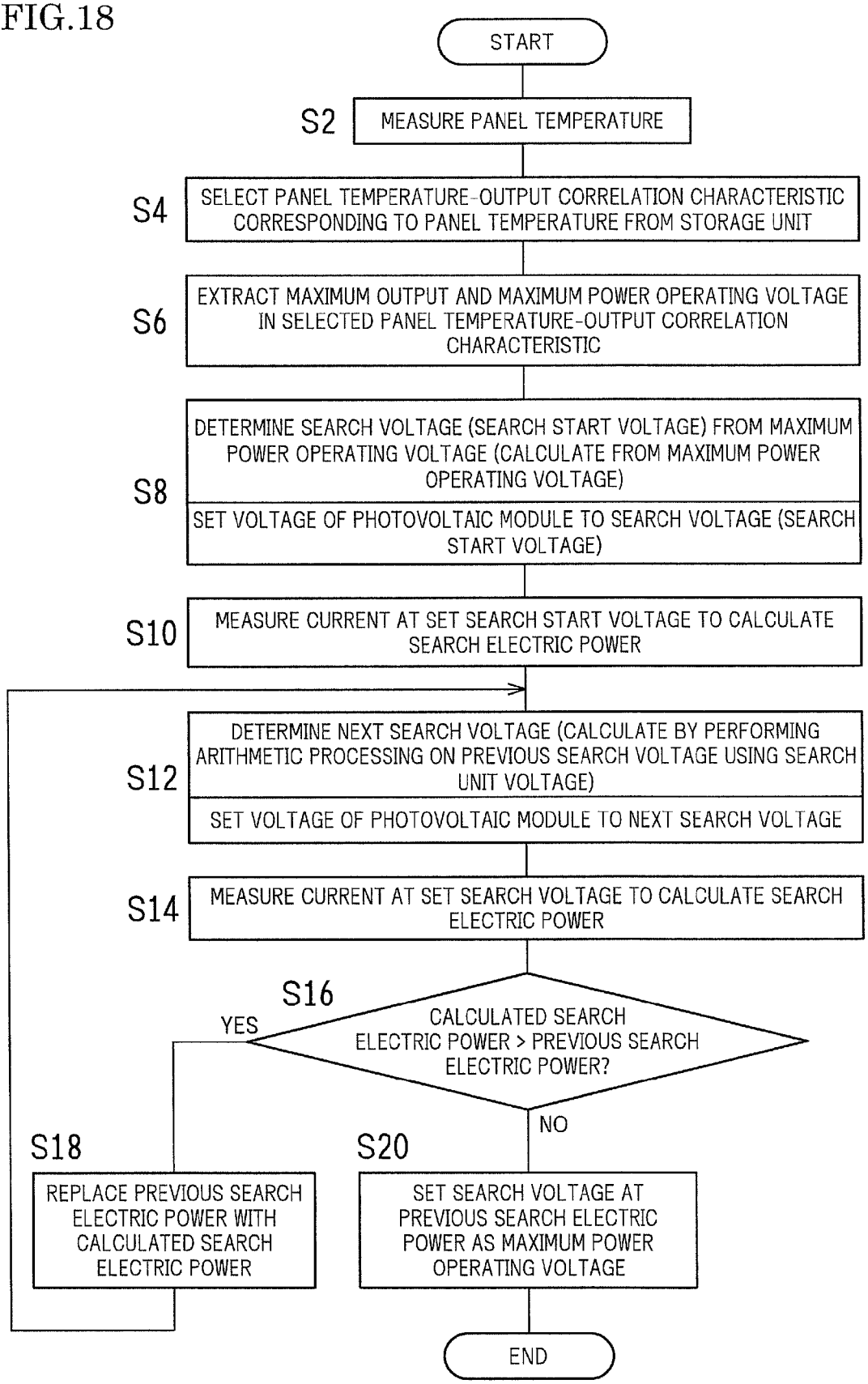
FIG. 18 is a flowchart illustrating an operation process in a tracking control device that constitutes a main portion of the photovoltaic apparatus illustrated in FIG. 17.

FIG. 18 is a flowchart illustrating an operation process in a tracking control device 20 that constitutes a main portion of the photovoltaic apparatus 1 illustrated in FIG. 17.

FIG. 19 is a graph illustrating a state of maximum power point tracking control in the tracking control device 20 that constitutes the main portion of the photovoltaic apparatus 1 illustrated in FIG. 17.

(Embodiment 2-1)

First, as (Embodiment 2-1), by referring mainly to FIG. 17 (the functional blocks), a description will be given of the photovoltaic apparatus 1 (here, FIG. 19 is referred as necessary).

The photovoltaic apparatus 1 according to this embodiment includes a photovoltaic module 10 and a tracking control device 20. In the photovoltaic module 10, a plurality of series portions 12 with a plurality of photovoltaic elements 11 coupled in series are coupled in parallel, and the photovoltaic elements 11 coupled in the same straight row among the plurality of series portions 12 are coupled parallel to one another. The tracking control device 20 performs a maximum power point tracking control (MPPT control) at the output of the photovoltaic module 10.

The photovoltaic module 10 includes a temperature sensor 18 that detects a real panel temperature RTp that is a panel temperature Tp when the photovoltaic module 10 is operating.

The tracking control device 20 includes, as basic data acquisition units, a temperature information input unit 21, a voltage information input unit 22v, and a current information input unit 22i. The temperature information input unit 21 acquires a temperature (a panel temperature Tp, that is, a real panel temperature RTp) detected by the temperature sensor 18 through a signal line 18w. The voltage information input unit 22v acquires a voltage value (an output voltage; a search voltage, or a set voltage) of the photovoltaic module 10 output from an output line 14 through a signal line 16w. The current information input unit 22i acquires a current value (output current) of the photovoltaic module 10 output from the output line 14 through the signal line 16w.

The tracking control device 20 includes, as a first main portion, a storage unit 23, an output characteristic selecting unit 24, and a search start setting unit 25.

In the storage unit 23, a panel temperature-output correlation characteristic P-V (Tp) where a correlation relationship between the panel temperature Tp and the output characteristic P-V (Tp) in the photovoltaic module 10 is preliminarily specified is registered as a plurality portions of listed data corresponding to the panel temperature Tp (see FIG. 15 and FIG. 16). "Tp" in the panel temperature-output correlation characteristic P-V (Tp) corresponds to the temperature exemplarily illustrated in FIG. 15 and FIG. 16 as the data.

The output characteristic selecting unit 24 selects (extracts) one panel temperature-output correlation characteristic P-V (Tp) corresponding to the real panel temperature RTp among a plurality of panel temperature-output correlation characteristics P-V (Tp) as a virtual panel temperature-output correlation characteristic P-V (Tp) (FIG. 19). Subsequently, the output characteristic selecting unit 24 extracts (selects) a maximum power operating voltage Vpm0 corresponding to a maximum output Pmx in the virtual panel temperature-output correlation characteristic P-V (Tp). Here, the maximum power operating voltage Vpm0 may be described simply as, for example, a maximum power operating voltage Vpm.

In the storage unit 23, the panel temperature Tp and the maximum power operating voltage Vpm (Vpm0) corresponding to the maximum output Pmx at the assumed lighting intensity are registered. This allows a direct extraction of the maximum power operating voltage Vpm corresponding to the real panel temperature RTp. Here, the assumed lighting intensity is, as described above, preferred to be the maximum lighting intensity assumed in an environment where the photovoltaic module 10 operates. The maximum lighting intensity can be obtained considering direct light and a similar parameter in midsummer with respect to, for example, lighting intensity in spring and fall. Alternatively, for each season (corresponding to variation in altitude of sunlight), the assumed maximum lighting intensity can be changed.

While in FIG. 19 the virtual panel temperature-output correlation characteristic P-V (Tp) is illustrated as a curved line, any configuration is possible insofar as three portions of data of the maximum output Pmx, and the maximum power operating voltage Vpm and the panel temperature Tp corresponding to the maximum output Pmx are clear when the MPPT control is performed. The maximum output Pmx is a target for comparison with the output characteristic P-V (RTp) for the real panel temperature RTp.

In an actual operation state, the real panel temperature RTp may have a different value from that of the panel temperature Tp registered in the storage unit 23. That is, in the case where the real panel temperature RTp is different from the panel temperature Tp registered in the storage unit 23, the output characteristic selecting unit 24 extracts a panel temperature-output correlation characteristic P-V (Tp) corresponding to a panel temperature Tp that is lower than and closest to the real panel temperature RTp among the panel temperatures Tp registered in the storage unit 23 as the virtual panel temperature-output correlation characteristic P-V (Tp).

With this configuration, the photovoltaic apparatus 1 extracts the panel temperature-output correlation characteristic P-V (Tp) corresponding to the panel temperature Tp that is lower than and closest to the real panel temperature RTp among the panel temperatures Tp registered in the storage unit 23 as the virtual panel temperature-output correlation characteristic P-V (Tp). This allows extraction of the virtual panel temperature-output correlation characteristic P-V (Tp) to limit a search range of any real panel temperature RTp to a narrow range and perform the maximum power point tracking control.

The search start setting unit 25 extracts electric power from the photovoltaic module 10 as a search electric power Pt1 when a search is started in the case where a voltage of the photovoltaic module 10 is set to a search start voltage Vt1 (FIG. 19) that is a voltage higher than the maximum power operating voltage Vpm0.

In the search start setting unit 25, setting of the search start voltage Vt1 is performed as follows. By instruction of the search start setting unit 25, any PWM signal is input from a search control unit 28 to a power converter 30. The power converter 30 (a DC-DC converter) regulates a voltage of the photovoltaic module 10 (the output line 14). Here, the PWM signal may be directly input from the search start setting unit 25 to the power converter 30 not through the search control unit 28. Additionally, the search start setting unit 25 and the search control unit 28 may be integrated to operate together.

Hereinafter, any additional character may be added corresponding to a state of the search voltage Vt, for example, the search start voltage Vt1, the search voltage Vt2, and so on. Additionally, if the respective voltages specifically need not be distinguished from one another, the search voltages may be described simply as search voltages Vt. Additionally, the same applies to search electric powers Pt (a search electric power Pt1, a search electric power Pt2, and so on) corresponding to the search voltages Vt.

The search electric power Pt (such as the search electric power Pt1, FIG. 19) is calculated by multiplication of a current value of the current information input unit 22i and a voltage value (the search start voltage Vt1) of the voltage information input unit 22v that are obtained as output of the photovoltaic module 10 in a state where the output of the photovoltaic module 10 is set to the search voltage Vt (such as the search start voltage Vt1, FIG. 19).

The search start voltage Vt1 is calculated by a formula for computation preliminarily specified with respect to the maximum power operating voltage Vpm0 or the open circuit voltage Voc that has a relative relationship with the maximum power operating voltage Vpm0. With this configuration, the photovoltaic apparatus 1 calculates the search start voltage Vt1 by applying the formula for computation to the maximum power operating voltage Vpm0 in the virtual panel temperature-output correlation characteristic P-V (Tp). This allows obtaining the search start voltage Vt1 accurately and quickly even in any irradiation state of the photovoltaic module 10.

Here, the formula for computation employs a formula (a formula for computation 1) where a preliminarily specified margin voltage ΔVm (FIG. 19) is added to the maximum power operating voltage Vpm0 to specify the search start voltage Vt1, a formula (a formula for computation 2) where a preliminarily specified rate (coefficient) is multiplied by the maximum power operating voltage Vpm0 to specify the search start voltage Vt1 that is a result of the maximum power operating voltage Vpm0 with the addition of the margin voltage ΔVm, and a formula (a formula for computation 3) where the search start voltage Vt1 is calculated based on the open circuit voltage Voc. In FIG. 19, results (the margin voltages ΔVm) of all the formulas for computation coincide with one another.

In the formula for computation 1, the margin voltage ΔVm as an absolute value is preliminarily assigned to the maximum power operating voltage Vpm0 in the virtual panel temperature-output correlation characteristic P-V (Tp), and is added to the maximum power operating voltage Vpm0 to calculate the search start voltage Vt1. Any value corresponding to an actual value of the maximum power operating voltage Vpm0 may be set. For example, in the case where the maximum power operating voltage Vpm0 is 20 V (volts), 22 V is set as the search start voltage Vt1 by, for example, adding the margin voltage of 2 V as an absolute value. In this case, the margin voltage ΔVm=2 V is preliminarily set. Similarly, in the case where the maximum power operating voltage Vpm0 is 50 V, for example, 5 V is added for calculation.

In the formula for computation 2, a coefficient k is multiplied by the maximum power operating voltage Vpm0 in the virtual panel temperature-output correlation characteristic P-V (Tp) to directly calculate the search start voltage Vt1. That is, as the search start voltage Vt1=k×the maximum power operating voltage Vpm0, the calculation is performed. In the case where the coefficient k>1, the calculation is the same as that in the case where the margin voltage ΔVm is preliminarily added. In the case where k=1.1, the search start voltage Vt1 is calculated as a result where the margin voltage ΔVm of 10% is added to the maximum power operating voltage Vpm0. Accordingly, in the case of the formula for computation 2, the margin voltage ΔVm is expressed by the search start voltage Vt1−the maximum power operating voltage Vpm0.

For example, in the case where the maximum power operating voltage Vpm0 is 20 V (volts), the search start voltage Vt1 of 22 V may be set by multiplying 20 V by k=1.1. In this case, the margin voltage ΔVm=the search start voltage Vt1− the maximum power operating voltage Vpm0=2V is satisfied. Similarly, in the case where the maximum power operating voltage Vpm0 is 50 V, the search start voltage Vt1 is set to 55 V by multiplying 50 V by k=1.1.

The coefficient k is preferred to be around 1.2 at most such that a result where the maximum power operating voltage Vpm is multiplied by the coefficient k is equal to or less than the open circuit voltage Voc. That is, in the case where the coefficient k is expressed by 1<k≤1.2, a voltage larger than the maximum power operating voltage Vpm0 may be set as the search start voltage Vt1. Additionally, a search range may be sufficiently limited. This allows performing an accurate and quick search.

The formula for computation 2 calculates the search start voltage Vt1 by multiplying the maximum power operating voltage Vpm0 by the coefficient k. This allows directly applying the formula for computation 2 even in the case where the maximum power operating voltage Vpm0 varies depending on the specification of the photovoltaic module 10. This ensures a versatile calculation method. Additionally, even in the case where the maximum power operating voltage Vpm0 completely varies depending on the specification, this accurately determines the search start voltage Vt1 with a constant ratio. This ensures a versatile process where setting of the search start voltage Vt1 is stable.

As described above, the formula for computation 2 is preferred to obtain the search start voltage Vt1 by multiplying the maximum power operating voltage Vpm0 by the coefficient larger than one. With this configuration, the photovoltaic apparatus 1 obtains the search start voltage Vt1 by multiplying the maximum power operating voltage Vpm0 by a coefficient larger than one. With any specification of the maximum power operating voltage Vpm0 of the photovoltaic module 10, this suppresses the impact of the specification so as to extract an accurate search start voltage Vt1.

In the formula for computation 3, the open circuit voltage Voc extracted from the virtual panel temperature-output correlation characteristic P-V (Tp) with respect to the panel temperature Tp is applied to calculate the search start voltage Vt1. The formula for computation 3 employs various computing equations as described below.

The open circuit voltage Voc is multiplied by a unique element constant q (see explanation of FIG. 16) to calculate the maximum power operating voltage Vpm0. Subsequently, an operation for calculating a numerical value between the maximum power operating voltage Vpm0 and the open circuit voltage Voc is performed to specify the search start voltage Vt1.

In the case where the formula for computation 3 is expressed as, for example, (the open circuit voltage Voc+(the unique element constant q×the open circuit voltage Voc))/2, (the open circuit voltage Voc+the maximum power operating voltage Vpm0)/2 is equivalently operated. Accordingly, the search start voltage Vt1 between the open circuit voltage Voc and the maximum power operating voltage Vpm0 is calculated.

Alternatively, operating (the open circuit voltage Voc+the maximum power operating voltage Vpm0)/2 as described above allows calculating the search start voltage Vt1 directly from the open circuit voltage Voc and the maximum power operating voltage Vpm0. In this case, operation using the unique element constant q is not necessary. This ensures a simpler operation.

The unique element constant q is preliminarily clear as a numerical value indicative of a relationship between the open circuit voltage Voc and the maximum power operating voltage Vpm by an element structure. Accordingly, if a constant koc that satisfies 1>koc>q is preliminarily specified, applying the constant koc×the open circuit voltage Voc=the search start voltage Vt1 as the formula for computation 3 allows calculating the search start voltage Vt1 (the open circuit voltage Voc>the search start voltage Vt1>the maximum power operating voltage Vpm0) based on the open circuit voltage Voc.

In the case where the photovoltaic element is a single-crystal silicon solar cell, Vpm0=q×Voc=0.8×Voc is satisfied. Accordingly, Vpm (T)=0.8×Voc (T) is satisfied. Additionally, in the case where the photovoltaic element is an amorphous silicon solar cell, Vpm0=q×Voc=0.66×Voc is satisfied. Similarly, Vpm (T)=0.66×Voc (T) is used to perform any arithmetic processing.

A difference (a margin voltage ΔVm) between the maximum power operating voltage Vpm0 extracted from the virtual panel temperature-output correlation characteristic P-V (Tp) and the search start voltage Vt1 calculated by operation on the maximum power operating voltage Vpm0 is, in other words, to set a high voltage with a constant margin (the margin voltage ΔVm) with respect to the maximum power operating voltage Vpm0 as the search start voltage Vt1. This allows extracting the maximum power point (MPP) by a search in a preliminarily limited narrow range, thus improving search accuracy and search speed.

Using a concrete example, as described above, on the maximum power operating voltage Vpm0 extracted from the virtual panel temperature-output correlation characteristic P-V (Tp), a search within a narrow voltage range such as about 10% is performed to extract and set the maximum power operating voltage Vpmn (see the panel temperature-output correlation characteristic P-V (RTp) in FIG. 19) with respect to the real panel temperature RTp. This allows a quick tracking.

The tracking control device 20 starts a search using the search start voltage Vt1 and the search electric power Pt1 when the search is started as references, and extracts the maximum power point MPP (RTp) of the photovoltaic module 10 at the real panel temperature RTp (see FIG. 19). That is, the tracking control device 20 performs the MPPT control that tracks the maximum power point MPP. The tracking control device 20 obviously performs a search shifting to a lower voltage side with respect to the search start voltage Vt1.

As described above, the photovoltaic apparatus 1 according to this embodiment performs a basic MPPT control using the storage unit 23, the output characteristic selecting unit 24, and the tracking control device 20.

Accordingly, the photovoltaic apparatus 1 according to this embodiment detects the real panel temperature RTp of the photovoltaic module 10 where the plurality of photovoltaic elements 11 are coupled in series and in parallel and the photovoltaic elements 11 in the same straight row are coupled parallel to one another, and extracts one panel temperature-output correlation characteristic P-V (Tp) corresponding to the real panel temperature RTp as the virtual panel temperature-output correlation characteristic P-V (Tp). Accordingly, the photovoltaic apparatus 1 sets the voltage of the photovoltaic module 10 to the search start voltage Vt1 higher than the maximum power operating voltage Vpm0 in the virtual panel temperature-output correlation characteristic P-V (Tp), and starts a search using the search start voltage Vt1 and the search electric power Pt1 when the search is started as references to perform the maximum power point tracking control. This allows simple and accurate setting of the maximum power operating voltage Vpmn in the detected real panel temperature RTp using a search in a narrow range so as to simply, accurately, and quickly track (search) the maximum power point MPP (RTp) (see FIG. 19) in the output characteristic P-V (RTp) of the photovoltaic module 10.

In FIG. 19, the maximum power point MPP (Tp) in the virtual output characteristic P-V (Tp) and the maximum power point MPP (RTp) in the output characteristic P-V (RTp) at the real panel temperature RTp have panel temperatures Tp close to each other as described above, thus having a very approximate relationship as characteristic curves. Additionally, since the panel temperature Tp is lower than the real panel temperature RTp, the maximum power operating voltage Vpm0 corresponding to the maximum power point MPP (Tp) is slightly higher than the maximum power operating voltage Vpmn corresponding to the maximum power point MPP (RTp). This allows an assured search.

That is, as described in FIG. 13, in the same temperature state (at the same panel temperature Tp), the maximum power operating voltage Vpm0 and the maximum power operating voltage Vpmn have little difference (the range corresponding to ΔVpm(S) in FIG. 13). Accordingly, performing a search in an extremely limited narrow search range (a range considering the difference between the maximum power operating voltage Vpm0 and the maximum power operating voltage Vpmn within a range from the maximum power operating voltage Vpm0 to the search start voltage Vt1) allows simple extraction of the maximum power operating voltage Vpmn for an extremely simple and quick method of tracking the maximum power point MPP (RTp).

The first main portion of the tracking control device 20 has been described above. Next, a description will be given of a second main portion of the tracking control device 20.

The tracking control device 20 includes a search processor 26, a search power comparator 27, and the search control unit 28.

The search processor 26 extracts electric power from the photovoltaic module 10 as a search electric power Pt2, a search electric power Pt3 (not shown, same below), and so on for search (FIG. 19). The extracted electric power is an electric power when the search voltage Vt2, the search voltage Vt3, and so on for search are set by sequentially decreasing the voltages of the photovoltaic module 10 from the search start voltage Vt1, the search voltage Vt2, the search voltage Vt3 (not shown, same below), and so on by a preliminarily set search unit voltage ΔVs.

As the search electric power Pt with respect to the search voltage Vt, there is a corresponding point on a curved line of the panel temperature-output correlation characteristic P-V (RTp), which is almost approximated as the virtual panel temperature-output correlation characteristic P-V (Tp). That is, a search in the MPPT control is performed on the curved line of the output characteristic P-V (RTp).

In the first search, the search processor 26 calculates the search voltage Vt2 by the formula for computation expressed by the search voltage Vt2=the search start voltage Vt1−the search unit voltage ΔVs, and controls the power converter 30 to set the search voltage Vt2. Here, the setting of the search voltage Vt2 is performed such that any PWM signal is input from the search control unit 28 to the power converter 30 by instruction from the search processor 26, and the power converter 30 regulates the voltage of the photovoltaic module 10 (the output line 14). That is, the voltage of the photovoltaic module 10 (the output line 14) is set to the search voltage Vt2 by the control of the power converter 30.

The search processor 26 extracts the search electric power Pt2 after setting the search voltage Vt2. In the extraction of the search electric power Pt2, signals from voltmeter and ammeter 16 are input to the current information input unit 22i through the signal line 16w. Accordingly, the search electric power Pt2 is calculated by obtaining a product of a current value obtained by the current information input unit 22i and the search voltage Vt2. That is, using the search voltage Vt2 as it is, the search electric power Pt2 in the output characteristic P-V (RTp) is extracted.

In the setting of the search voltage Vt2, this allows inputting the PWM signal from the search processor 26 directly to the power converter 30 not through the search control unit 28. The search processor 26 and the search control unit 28 may be integrated to operate.

Hereinafter, a search after the second time is similarly performed. That is, the second search is calculated as the search voltage Vt3=the search voltage Vt2−the search unit voltage ΔVs. The third search is calculated as the search voltage Vt4=the search voltage Vt3−the search unit voltage ΔVs. Corresponding to the calculated search voltage Vt, the output (output voltage) of the photovoltaic module 10 (the output line 14) is set to the search voltage Vt. Using the set search voltage Vt as it is, the search electric power Pt is calculated.

The search unit voltage ΔVs is preferred to be set lower than ½ of the difference between the maximum power operating voltage Vpm0 and the search start voltage Vt1. This configuration set the search unit voltage ΔVs to a value smaller than ½ of the difference between the maximum power operating voltage Vpm0 and the search start voltage Vt10. Accordingly, when a search is performed such that the search voltage Vt is decrementally shifted to a lower side of the voltage by the search unit voltage ΔVs from the search start voltage Vt1 to the maximum power operating voltage Vpm0 side, the configuration allows performing at least a plurality of searches between the search start voltage Vt1 and the maximum power operating voltage Vpm0. This ensures a highly accurate and quick search.

The search power comparator 27 compares (determine) the search electric power Pt1, the search electric power Pt2, and so on before the voltage of the photovoltaic module 10 is decreased by the search unit voltage ΔVs, with the search electric power Pt2, the search electric power Pt3, and so on when the voltage of the photovoltaic module 10 is decreased by the search unit voltage ΔVs.

That is, in the first search, the search electric power Pt1 at the search start voltage Vt1 is compared with the search electric power Pt2 at the search voltage Vt2. The magnitude relationship between the search electric power Pt2 and the search electric power Pt1 is compared. In the example illustrated in FIG. 19, the search electric power Pt2−the search electric power Pt1=ΔPt>0 is satisfied. Subsequently, the next (second) search is performed.

In the second search, the search electric power Pt2 at the search voltage Vt2 is compared with the search electric power Pt3 (not shown) at the search voltage Vt3 (not shown). The magnitude relationship expressed by the search electric power Pt3 versus the search electric power Pt2 is compared.

Hereinafter, the magnitude relationships for search electric power Pt before and after the search voltage Vt is similarly decreased are compared sequentially. Thus, MPPT control is performed. Processes on the magnitude relationships of the search electric powers Pt is performed by the search control unit 28 described below.

In the case where the search electric power Pt1 before the voltage of the photovoltaic module 10 is decreased by the search unit voltage ΔVs is higher than the search electric power Pt2 when the voltage of the photovoltaic module 10 is decreased by the search unit voltage ΔVs (corresponding to the previous state of the maximum power operating voltage Vpmn that is not illustrated in FIG. 19), the search control unit 28 sets the voltage of the photovoltaic module 10 before being decreased by the search unit voltage ΔVs to the maximum power operating voltage Vpmn at the real panel temperature RTp and terminates the search. In the case where the search electric powers Pt1 (sequentially, the search electric power Pt2 and so on) before the voltage of the photovoltaic module 10 is decreased by the search unit voltage ΔVs is lower than the search electric power Pt2 (sequentially, search electric power Pt3 and so on) when the voltage of the photovoltaic module 10 is decreased by the search unit voltage ΔVs, the search control unit 28 replaces the search electric power Pt2 (sequentially, the search electric power Pt3 and so on) at decreasing by the search unit voltage ΔVs with the search electric power Pt1 (sequentially, search electric power Pt2 and so on) before decreasing by the search unit voltage ΔVs to perform the process in the search power comparator 27.

The above-described search is repeated to terminate the search at the first decrement of the search unit voltage ΔVs that decreases the search electric power Pt with respect to the maximum power point MPP (RTp). This allows extracting the maximum power operating voltage Vpmn in the output characteristic P-V (RTp) within the extremely narrow range.

Accordingly, the photovoltaic apparatus 1, which includes the search processor 26, the search power comparator 27, and the search control unit 28, sequentially decreases the voltage from the search start voltage Vt by the preliminarily set search unit voltage ΔVs to be set to the search voltage Vt for search, and compares the search electric powers Pt before and after the search voltage Vt is changed by the search unit voltage ΔVs to perform the maximum power point tracking control. This allows efficient and quick setting of the maximum power operating voltage Vpmn with respect to the real panel temperature RTp by the search in the preliminarily set narrow range. Also in the case where the irradiation state of the light is frequently varied, this allows simple, accurate, and quick tracking of the maximum power point MPP (RTp) in the output characteristic P-V (RTp) of the photovoltaic module 10.

In the tracking control device 20, the functions and the coordinate operations of the temperature information input unit 21, the voltage information input unit 22v, the current information input unit 22i, the storage unit 23, the output characteristic selecting unit 24, the search start setting unit 25, the search processor 26, the search power comparator 27, and the search control unit 28 as described above are controlled by a tracking control unit 29.

That is, the tracking control unit 29 includes a central processing unit (CPU). A computer program that coordinates and controls operations from the temperature information input unit 21 to the search control unit 28 is preliminarily installed. The computer program is preliminarily stored in, for example, a program memory to function the tracking control unit 29 at any timing. Accordingly, the tracking control device 20 performs the MPPT control on the photovoltaic module 10 in the photovoltaic apparatus 1 based on the computer program.

The panel temperature-output correlation characteristic P-V (Tp) registered in the storage unit 23 associates the panel temperature Tp with the maximum power operating voltage Vpm0 corresponding to the maximum output Pmx, which is obtained by a preliminarily assumed lighting intensity for a panel temperature Tp.

Accordingly, the photovoltaic apparatus 1 directly associates the panel temperature Tp with the maximum power operating voltage Vpm0 corresponding to the maximum output Pmx at the panel temperature Tp in the panel temperature-output correlation characteristic P-V (Tp). Use of the virtual panel temperature-output correlation characteristic P-V (Tp) corresponding to the detected real panel temperature RTp allows an accurate and quick direct extraction of the maximum power operating voltage Vpm0 of the photovoltaic module 10. This allows accurate and quick selection of the search start voltage Vt1 to perform an accurate and quick maximum power point tracking control.

The setting (setting the voltage that is the output of the photovoltaic module 10) of the search voltages Vt (the search start voltage Vt1, the search voltage Vt2, and so on) is, as described above, performed as necessary based on the DC-DC converter included in the power converter 30 and the voltage values obtained by the voltage information input unit 22v. The extraction of the electric power (the search electric power Pt1, the search electric power Pt2, and so on) in the photovoltaic module 10 is calculated based on the signal from the voltmeter and ammeter 16 by multiplication of the current value extracted by the current information input unit 22$i$ and the voltage value extracted by the voltage information input unit 22$v$.

The DC-DC converter (the power converter 30) has a configuration that, for example, increases or decreases the output voltage of the photovoltaic module 10. As a load of the power converter 30, a battery BT constituted by a charging battery is coupled.

The DC-DC converter is controlled as necessary by a PWM signal that is a control signal generated by the search control unit 28 (alternatively, as necessary, the search start setting unit 25 and the search processor 26). The power converter 30 and the DC-DC converter (the power converter 30) are operated by applying general techniques. Thus, the details will not be further elaborated here.

The search start voltage Vt1 (the search voltage Vt1) and the search electric power Pt1 when the search is started are set to points (for example, the search start voltage Vt1 is of 22 V where the maximum power operating voltage Vpm0 is higher than 20 V by 10%) close to the maximum power operating voltage Vpm0 and the maximum output Pmx at the panel temperature Tp (the closest panel temperature Tp at low temperature side) corresponding to the real panel temperature RTp to start the search. This allows quickly performing the MPPT control in a narrow search range (several volts).

In the maximum power point tracking control by the photovoltaic apparatus 1 (the tracking control device 20) according to this embodiment, the search range employs an extremely limited range. This significantly decreases power consumption in the tracking control device 20 and ensures an efficient photovoltaic apparatus 1.

(Embodiment 2-2)

Hereinafter, as (Embodiment 2-2), by referring mainly to FIG. 18, descriptions will be given of a maximum power point tracking control method in the photovoltaic apparatus 1 and a computer program that allows a computer to execute the maximum power point tracking control in the photovoltaic apparatus 1 (here, FIG. 19 is referred as necessary).

Step S2:

The panel temperature Tp is measured. Here, in the case where a plurality of temperature sensors 18 are used, temperatures obtained from the respective temperature sensor 18 are simply averaged as the panel temperature Tp (the real panel temperature RTp). The data of the temperature sensor 18 is input to the temperature information input unit 21 through the signal line 18$w$, and the real panel temperature RTp is detected.

Step S4:

The output characteristic selecting unit 24 extracts and selects the panel temperature-output correlation characteristic P-V (Tp) (hereinafter, for the sake of simplification, referred to as the output characteristic P-V (Tp) in some cases) corresponding to the panel temperature Tp (the real panel temperature RTp) from the storage unit 23. That is, the output characteristic P-V (Tp) of the panel temperature Tp corresponding to the real panel temperature RTp is selected from "panel temperature-output correlation characteristic listed data" preliminarily registered in the storage unit 23. The output characteristic P-V (Tp) is selected as the virtual panel temperature-output correlation characteristic P-V (Tp).

For example, in the case where the panel temperature Tp registered in the storage unit 23 is 25° C. and the detected real panel temperature RTp is 26° C., the respective panel temperatures Tp do not coincide with each other. In the case where the panel temperature Tp matching to the real panel temperature RTp is not registered, the output characteristic P-V (Tp) (FIG. 19) at the closest panel temperature Tp with respect to the real panel temperature RTp at the low temperature side is selected. The photovoltaic module 10 outputs a high electric power at the panel temperature Tp of the low temperature side. On the maximum power point MPP (RTp) and the maximum power operating voltage Vpmn (which are not detected in this phase) in the output characteristic P-V (RTp) that is a control target, an accurate and quick search is performed in a narrow range from the high search voltage Vt side to the low search voltage Vt side (from the low search electric power Pt side to the high search electric power Pt side).

Step S6:

The output characteristic selecting unit 24 extracts (selects) the maximum output Pmx at the maximum power point MPP (Tp) in the selected output characteristic P-V (Tp), and the maximum power operating voltage Vpm0 corresponding to the maximum output Pmx. Hereinafter, descriptions of the panel temperature Tp and the real panel temperature RTp are omitted in some cases.

Step S8:

The search start setting unit 25 calculates (determines) the search start voltage Vt1 that is a voltage when the MPPT control is started from the maximum power operating voltage Vpm0 extracted based on the output characteristic P-V (Tp) (FIG. 19). Additionally, the search start setting unit 25 makes the power converter 30 control the output of the photovoltaic module 10, and sets the voltage of the photovoltaic module 10 to the search start voltage Vt1. That is, the search start setting unit 25 controls the power converter 30 (the DC-DC converter) to set the voltage of the solar cell module to the search voltage Vt1 (the search start voltage Vt1).

The first search voltage Vt (the search start voltage Vt1) is, for example, calculated (determined) as the search start voltage Vt1=the coefficient k×the maximum power operating voltage Vpm0. Regardless of the coefficient k, a preliminarily specified absolute value may be added for calculation. By referring to the open circuit voltage Voc, the search start voltage Vt1 may be calculated.

Step S10:

The search start setting unit 25 measures current at the set search start voltage Vt1 to obtain the output (the electric power) of the photovoltaic module 10. The obtained output is calculated as the search electric power Pt1 when starting the search.

Step S12:

The search processor 26 performs arithmetic processing (subtraction in this embodiment) using the search unit voltage ΔVs (FIG. 19) on the search voltage Vt before the operation in this step is performed to calculate (determine) the next search voltage Vt. A computing equation is expressed by the previous search voltage Vt−the search unit voltage ΔVs=the next search voltage Vt. Specifically, the search voltage Vt2 in the first search=the search start voltage Vt1−the search unit voltage ΔVs is satisfied. The search voltage Vt3 in the second search=Vt2−ΔVs is satisfied. The search voltage Vtn4 in the third search=Vt3−ΔVs is satisfied. The search voltage Vt3, the search voltage Vtn4, and so on are not illustrated.

The search unit voltage ΔVs is preliminarily set. The search unit voltage ΔVs is necessary to be lower than at least the margin voltage ΔVm. That is, the search unit voltage ΔVs is preferred to have extent of a value that allows performing searches at least several times within the range of the margin voltage ΔVm (the search start voltage Vt1 to the maximum power operating voltage Vpm0).

The search unit voltage ΔVs can also be obtained by multiplying the margin voltage ΔVm by the coefficient q (1>q (for example, q=0.3)>0) that is smaller than one. That is, the calculation may be performed by the search unit voltage $\Delta Vs = q \times$ the margin voltage $\Delta Vm$. Use of the coefficient q applied to the multiplication allows a simple and accurate determination (calculation) about the search unit voltage $\Delta Vs$ even in the case where, for example, the maximum power operating voltage Vpm varies depending on the photovoltaic module 10.

While the search unit voltage $\Delta Vs$ is described as a fixed value, the search unit voltage $\Delta Vs$ may be set as a variable value to be sequentially decreased. Setting as the variable value to be sequentially decreased allows a quicker and more accurate performance of the MPPT control.

The search processor 26 sets the voltage of the photovoltaic module 10 to the next search voltage Vt obtained by calculation. Similarly to the case of the search start voltage Vt1, the power converter 30 controls the voltage of the photovoltaic module 10.

Hereinafter, the search voltage Vt3, the search voltage Vt4, and so on are sequentially set.

Step S14:

The search processor 26 sequentially measures currents at the set search voltages Vt (Vt1, Vt2, Vt3, and so on), and calculates (extracts) the next search electric powers Pt (Pt1, Pt2, Pt3 (the rest is not shown), and so on).

Step S16:

The search power comparator 27 determines whether or not the calculated next search electric power Pt is higher than the previous search electric power Pt. For example, in the case where the n-th search and the (n+1)-th search are performed, "the next search electric power Ptn (n=n+1)" and "the previous search electric power Ptn" are compared.

In the case where the next search electric power Ptn (n=n+1) is higher than the previous search electric power Ptn (YES in step S16), the process proceeds to S18. Additionally, in the case where "the next search electric power Ptn (n=n+1)" is lower than "the previous search electric power Ptn" (NO in step S16), the process proceeds to S20.

Step S18:

The search control unit 28 replaces the search electric power Ptn before being decreased by the search unit voltage $\Delta Vs$ with the next search electric power Ptn (n=n+1) calculated when being decreased by the search unit voltage $\Delta Vs$. The process then returns to step S12.

Step S20:

The search control unit 28 sets the search voltage Vtn at the previous search electric power Ptn to a new maximum power operating voltage Vpmn, and terminates the MPPT control.

As described above, this embodiment is performed as the maximum power point tracking control method in the photovoltaic apparatus 1.

That is, the maximum power point tracking control method in the photovoltaic apparatus 1 according to this embodiment is a maximum power point tracking control method in the photovoltaic apparatus 1 that includes a photovoltaic module 10 and a tracking control device 20. The photovoltaic module 10 includes a plurality of series portions 12 coupled in parallel. The series portion 12 includes a plurality of photovoltaic elements 11 coupled in series. The photovoltaic elements 11 coupled in a same straight row of the plurality of series portions 12 are coupled parallel to one another. The tracking control device 20 is configured to perform a maximum power point tracking control on an output of the photovoltaic module 10. In the maximum power point tracking control method, the photovoltaic module 10 includes a temperature sensor 18. The temperature sensor 18 is configured to detect a real panel temperature RTp. The real panel temperature RTp is a panel temperature Tp when the photovoltaic module 10 is operating. The tracking control device 20 includes a storage unit 23, an output characteristic selecting unit 24, and a search start setting unit 25. In the storage unit 23, a plurality of panel temperature-output correlation characteristics P-V (Tp) are registered corresponding to the panel temperature Tp. The panel temperature-output correlation characteristic P-V (Tp) preliminarily specifies a correlation relationship between the panel temperature Tp and the output characteristic P-V (Tp) in the photovoltaic module 10. Additionally, the maximum power point tracking control method includes: a step of detecting a real panel temperature RTp by the temperature sensor 18 (step S2); a step of extracting one of the panel temperature-output correlation characteristics P-V (Tp) corresponding to the real panel temperature RTp among the plurality of panel temperature-output correlation characteristics P-V (Tp) as a virtual panel temperature-output correlation characteristic P-V (Tp), and selecting a maximum power operating voltage Vpm0 corresponding to a maximum output in the virtual panel temperature-output correlation characteristic P-V (Tp) by the output characteristic selecting unit 24 (step S4 and step S6); a step of extracting an electric power of the photovoltaic module 10 when a voltage of the photovoltaic module 10 is set to a search start voltage Vt1 higher than the maximum power operating voltage Vpm0 as a search electric power Pt1 when a search is started, by the search start setting unit 25 (step S8 and step S10); and a step of starting a search using the search start voltage Vt1 and the search electric power Pt1 when the search is started, as references, and a step of extracting a maximum power point MPP (RTp) of the photovoltaic module 10 at the real panel temperature RTp by the tracking control device 20 (step S12 to step S20).

Thus, the maximum power point tracking control method in the photovoltaic apparatus 1 according to the present invention includes: detecting a real panel temperature RTp of the photovoltaic module 10; selecting a maximum power operating voltage Vpm corresponding to a maximum output in the virtual panel temperature-output correlation characteristic P-V (Tp); extracting an electric power of the photovoltaic module 10 when a voltage of the photovoltaic module 10 is set to a search start voltage Vt1 higher than the maximum power operating voltage Vpm0 as a search electric power Pt1 when a search is started; then starting a search using the search start voltage Vt1 and the search electric power Pt1 when the search is started as references; and extracting a maximum power point MPP (RTp) of the photovoltaic module 10 at the real panel temperature RTp. This allows a simple and accurate setting of the maximum power operating voltage Vpmn at the detected real panel temperature RTp by a search in a narrow range, thus ensuring a simple, accurate, and quick tracking (searching) of the maximum power point MPP (RTp) of the output characteristic P-V (RTp) in the photovoltaic module 10.

With the maximum power point tracking control method in the photovoltaic apparatus 1 according to this embodiment, the search start voltage Vt1 higher than the maximum power operating voltage Vpm0 corresponding to the maximum output Pmx in the virtual panel temperature-output correlation characteristic P-V (Tp) is set to perform a search. This search with the narrow range allows setting the maximum power operating voltage Vpmn at the real panel temperature RTp by the search with the narrow range. This suppresses power consumption of the tracking control device 20 in the maximum power point tracking control, thus performing a quick and efficient control.

In the maximum power point tracking control method in the photovoltaic apparatus 1 according to this embodiment, the tracking control device 20 in the photovoltaic apparatus 1 includes the search processor 26, the search power comparator 27, and the search control unit 28.

That is, the maximum power point tracking control method according to this embodiment includes: a step of extracting the electric power of the photovoltaic module 10 as a search electric power Pt for search by a search processor 26, the electric power being obtained when a voltage of the photovoltaic module 10 is sequentially decreased from the search start voltage Vt1 by a preliminarily set search unit voltage ΔVs every time so as to be set to a search voltage for search (step S12 and step S14); a step of comparing the search electric power Ptn before the voltage of the photovoltaic module 10 is decreased by the search unit voltage ΔVs with the search electric power Ptn (n=n+1) when the voltage of the photovoltaic module 10 is decreased by the search unit voltage by a search power comparator 27 (step S16); and a step of setting the voltage of the photovoltaic module 10 before decreasing by the search unit voltage ΔVs to a maximum power operating voltage Vpmn at the real panel temperature RTp and terminating the search in the case where the search electric power Ptn before the voltage of the photovoltaic module 10 is decreased by the search unit voltage ΔVs is higher than the search electric power Ptn (n=n+1) when the voltage of the photovoltaic module 10 is decreased by the search unit voltage ΔVs, and replacing the search electric power Ptn before decreasing by the search unit voltage ΔVs with the search electric power Ptn (n=n+1) when decreasing by the search unit voltage ΔVs so as to perform a subsequent process in the search power comparator 27 by a search control unit 28 in the case where the search electric power Ptn before the voltage of the photovoltaic module 10 is decreased by the search unit voltage ΔVs is lower than the search electric power Ptn (n=n+1) when the voltage of the photovoltaic module 10 is decreased by the search unit voltage ΔVs (step S18 and step S20).

Accordingly, the maximum power point tracking control method in the photovoltaic apparatus 1 according to this embodiment efficiently and quickly sets the maximum power operating voltage Vpm0 corresponding to the real panel temperature RTp by the search with the preliminarily set narrow range. Even in the case where the irradiation state of the light is frequently varied, this allows a simple, accurate, and quick tracking of the maximum power point MPP (RTp) in the output characteristic P-V (RTp) of the photovoltaic module 10.

As described above, this embodiment is provided as a computer program that makes a computer execute the maximum power point tracking control in the photovoltaic apparatus 1.

The computer program according to this embodiment is a computer program for a computer to execute a maximum power point tracking control in the photovoltaic apparatus 1 that includes a photovoltaic module 10 and a tracking control device 20. The photovoltaic module 10 includes a plurality of series portions 12 coupled in parallel. The series portion 12 includes a plurality of photovoltaic elements 11 coupled in series. The photovoltaic elements 11 coupled in a same straight row of the plurality of series portions 12 are coupled parallel to one another. The tracking control device 20 is configured to perform a maximum power point tracking control on an output of the photovoltaic module 10. The photovoltaic module 10 includes a temperature sensor 18. The temperature sensor 18 is configured to detect a real panel temperature RTp. The real panel temperature RTp is a panel temperature Tp when the photovoltaic module 10 is operating. The tracking control device 20 includes a storage unit 23 where a plurality of panel temperature-output correlation characteristics P-V (Tp) are registered corresponding to the panel temperature Tp, an output characteristic selecting unit 24, and a search start setting unit 25. The panel temperature-output correlation characteristic P-V (Tp) preliminarily specifies a correlation relationship between the panel temperature Tp and the output characteristic P-V (Tp) in the photovoltaic module 10. The computer program causes a computer execute: a step of detecting a real panel temperature RTp using the temperature sensor 18 by the tracking control device 20 (step S2); a step of extracting one of the panel temperature-output correlation characteristics P-V (Tp) corresponding to the real panel temperature RTp among the plurality of panel temperature-output correlation characteristics P-V (Tp) as a virtual panel temperature-output correlation characteristic P-V (Tp), and selecting a maximum power operating voltage Vpm0 corresponding to a maximum output in the virtual panel temperature-output correlation characteristic P-V (Tp) by the output characteristic selecting unit 24 (step S4 and step S6); a step of extracting an electric power of the photovoltaic module 10 when a voltage of the photovoltaic module 10 is set to a search start voltage Vt1 higher than the maximum power operating voltage Vpm0 as a search electric power Pt1 when a search is started, by the search start setting unit 25 (step S8 and step S10); and a step of starting a search using the search start voltage Vt1 and the search electric power Pt1 when the search is started as references, and extracting a maximum power point MPP (RTp) of the photovoltaic module 10 at the real panel temperature RTp by the tracking control device 20 (step S12 to step S20).

Accordingly, the computer program, which makes the computer execute the maximum power point tracking control in the photovoltaic apparatus 1 according to this embodiment, makes the computer execute the maximum power point tracking control method in the photovoltaic apparatus 1 according to the present invention. This allows a simple and accurate setting of the maximum power operating voltage Vpmn at the detected real panel temperature RTp by a search in a narrow range, thus ensuring a simple, accurate, and quick tracking (searching) of the maximum power point MPP (RTp) of the output characteristic P-V (RTp) in the photovoltaic module 10.

In the computer program according to this embodiment, the tracking control device 20 in the photovoltaic apparatus 1 includes the search processor 26, the search power comparator 27, and the search control unit 28.

That is, the computer program for the computer according to this embodiment executes: a step of extracting extracts the electric power of the photovoltaic module 10 as a search electric power Pt for search where the electric power is obtained when a voltage of the photovoltaic module 10 is sequentially decreased from the search start voltage Vt1 by a preliminarily set search unit voltage ΔVs every time so as to be set to a search voltage for search by a search processor 26 (step S12 and step S14); a step of comparing the search electric power Ptn before the voltage of the photovoltaic module 10 is decreased by the search unit voltage ΔVs with the search electric power Ptn (n=n+1) when the voltage of the photovoltaic module is decreased by the search unit voltage ΔVs by a search power comparator 27 (step S16); and a step of setting the voltage of the photovoltaic module 10 before decreasing by the search unit voltage ΔVs to a maximum power operating voltage Vpmn at the real panel temperature RTp and terminating the search in the case where the search electric power Ptn before the voltage of the photovoltaic module 10 is decreased by the search unit voltage ΔVs is higher than the search electric power Ptn (n=n+1) when the voltage of the photovoltaic module 10 is decreased by the search unit voltage ΔVs, and replacing the search electric power Ptn before decreasing by the search unit voltage ΔVs with the search electric power Ptn (n=n+1) when decreasing by the search unit voltage ΔVs so as to perform a subsequent process in the search power comparator 27 by a search control unit 28 in the case where the search electric power Ptn before the voltage of the photovoltaic module 10 is decreased by the search unit voltage ΔVs is lower than the search electric power Ptn (n=n+1) when the voltage of the photovoltaic module 10 is decreased by the search unit voltage ΔVs (step S18 and step S20).

Accordingly, the computer program that makes the computer execute the maximum power point tracking control in the photovoltaic apparatus 1 according to the present invention efficiently and quickly sets the maximum power operating voltage Vpm0 corresponding to the real panel temperature RTp by the search with the preliminarily set narrow range. Even in the case where the irradiation state of the light is frequently varied, this allows a simple, accurate, and quick tracking of the maximum power point in the output characteristic P-V (RTp) of the photovoltaic module 10.

(Embodiment 3)

By referring to FIG. 20, a description will be given of a moving body 50 according to the present invention. On the moving body 50, the photovoltaic apparatus 1 according to Embodiment 1 or Embodiment 2 is mounted.

Figure 20:
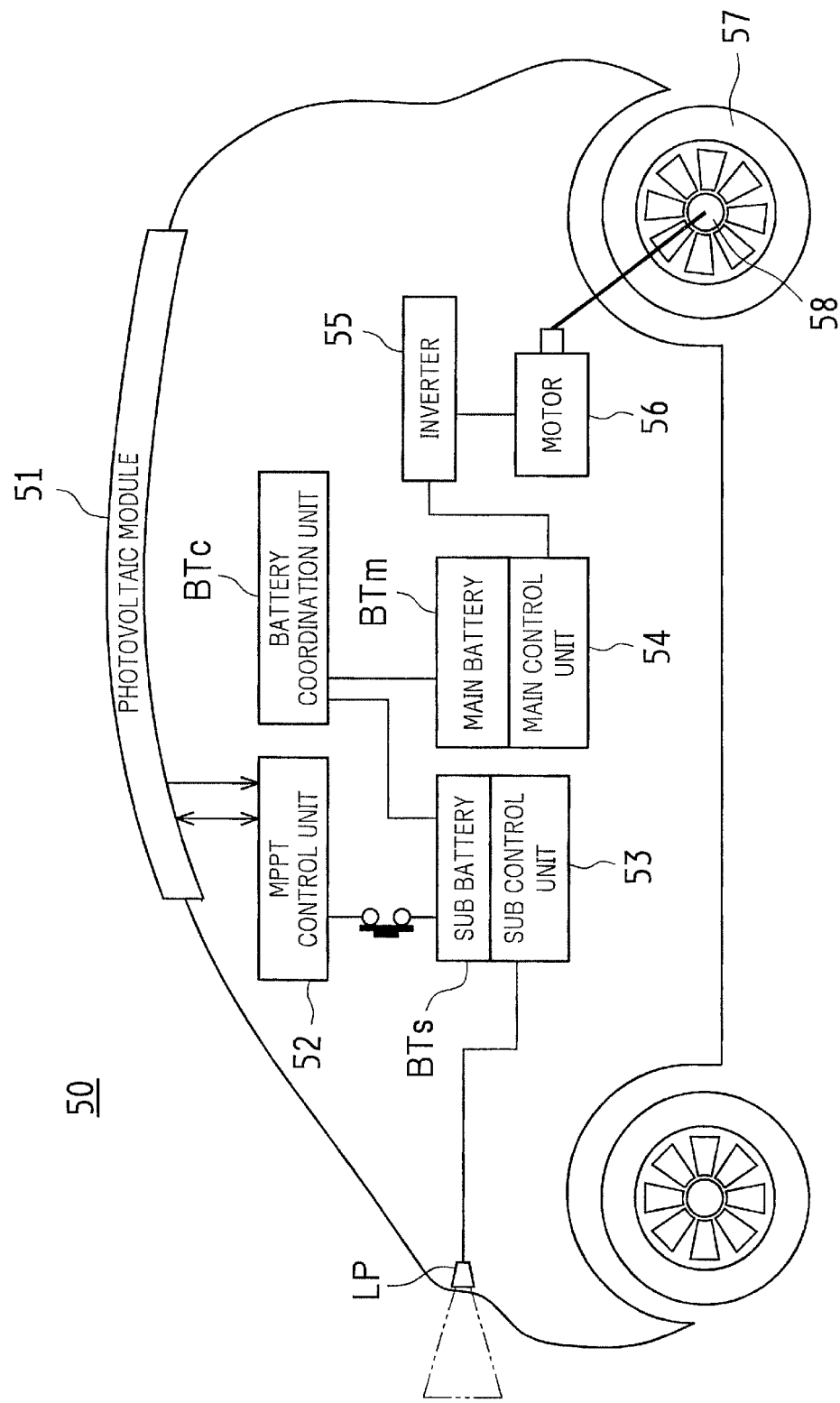
FIG. 20 is a block diagram illustrating functional blocks of a moving body according to Embodiment 3 of the present invention.
Figure 21:
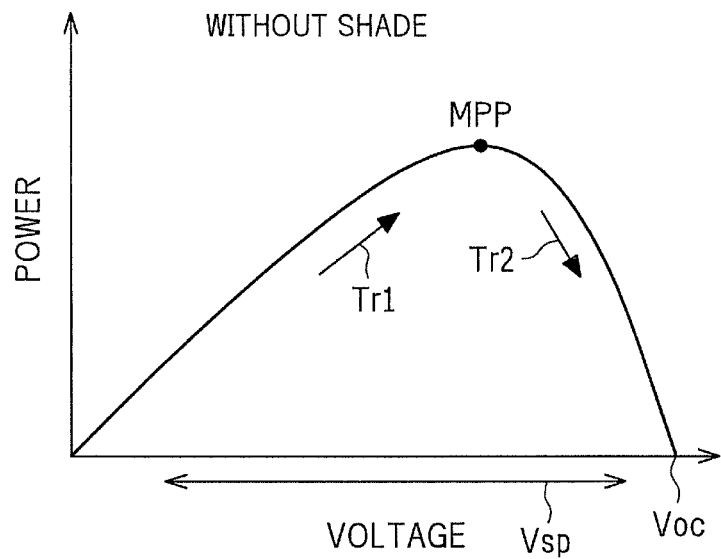
FIG. 21 is a characteristic graph illustrating an exemplary MPPT control with a normal output characteristic of a general solar cell module.
Figure 22:
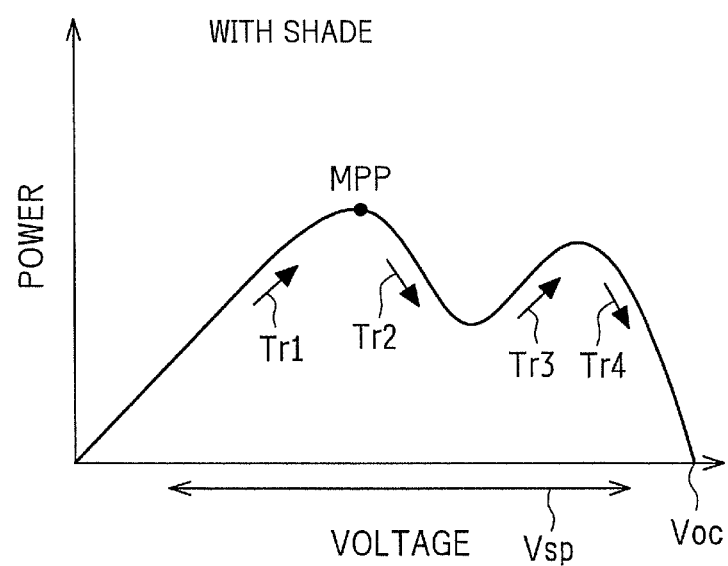
FIG. 22 is a characteristic graph illustrating an exemplary MPPT control with an output characteristic affected by a shade in the general solar cell module.

FIG. 20 is a block diagram illustrating functional blocks of the moving body 50 according to Embodiment 3 of the present invention.

The moving body 50 according to this embodiment includes a photovoltaic apparatus, a cell power supply (a main battery B™, a sub battery BTs, and a battery coordination unit BTc that controls a coordination between the main battery B™ and the sub battery BTs), and a motor 56. The photovoltaic apparatus includes a photovoltaic module 51 (corresponding to the photovoltaic module 10 according to Embodiment 1) and a MPPT control unit 52 (corresponding to the tracking control device 20 according to Embodiment 2) as a tracking control device that performs the maximum power point tracking control (MPPT control) on the output of the photovoltaic module 51. The cell power supply is charged by the photovoltaic apparatus (the photovoltaic module 51 and the MPPT control unit 52). The motor 56 operates by electric power supplied from the cell power supply. The motor 56 allows the moving body 50 to run.

The sub battery BTs is an electric power supply for a sub control unit 53 while the main battery BTm is an electric power supply for a main control unit 54. The sub control unit 53 controls, for example, a lamp LP and similar member used in a signaling system that is not related to a drive system. The main control unit 54 controls an inverter 55 using the electric power supplied from the main battery BTm. The inverter 55 drives the motor 56 to rotate a driving shaft 58 coupled to a wheel 57. Accordingly, the mounted photovoltaic apparatus (the photovoltaic module 51 and the MPPT control unit 52) allows the moving body 50 to run. The photovoltaic apparatus corresponds to the photovoltaic apparatus 1 according to Embodiment 2. The moving body 50 specifically corresponds to an electric vehicle (an electric car).

Accordingly, the moving body 50 according to the present invention includes the photovoltaic apparatus (the photovoltaic apparatus 1 according to Embodiment 2). This photovoltaic apparatus operates with the maximum output by the maximum power point tracking control corresponding to the real panel temperature RTp that is the panel temperature Tp when the photovoltaic module 10 is operating. The moving body 50 performs a quick and efficient maximum power point tracking control and suppresses power consumption in the control system caused by the maximum power point tracking control. This eliminates the impact of the shade during running to ensure a stable efficient electric generation and running.

The photovoltaic apparatus 1 ensures a control with extremely low power consumption in the maximum power point tracking control. Thus, applying the photovoltaic apparatus 1 to the moving body 50 provides a significant effect where the cell power supply is effectively utilized.

Operation and effect in the moving body 50 according to this embodiment will be supplementarily described below.

In an automobile or other vehicles during running, the shade is not constant. A state of the shade varies from moment to moment depending on a moving condition. Accordingly, applying the MPPT tracking control by a known simple hill-climbing method (a known algorithm) is practically impossible.

For example, the moving body running at 60 km per hour moves 1 m per 60 ms (msec). In the case where an MPP detection algorithm in the general hill-climbing method is applied, a clock frequency in a microcomputer (the tracking control device 20) is set to about 100 Hz to 200 kHz in the detection of the MPP. The MPP detection requires time of at least several tens of ms (msec). If the MPP detection is performed while the vehicle is running, the vehicle moves several m (meters) from start to completion of the detection. Accordingly, it is substantially difficult to perform an accurate MPP detection.

In contrast, in the photovoltaic module 10 employed in the moving body 50 according to this embodiment, the position of the maximum power operating voltage Vpm in the output characteristic P-V hardly varies depending on the state of the shade. Additionally, the panel temperature Tp of the photovoltaic module 10 hardly varies in a short time due to the state of the shade. Accordingly, the detection of the panel temperature Tp (the real panel temperature RTp) by the temperature sensor 18 allows a sufficiently efficient, and highly accurate MPPT control.

Especially, in the case where the photovoltaic module 10 has a constant size and integrally implemented, heat capacity becomes larger. The photovoltaic module 10 is hardly affected by temperature change, and does not generate a rapid temperature change due to variation in the external environment (in the sun/in the shade) during running.

Accordingly, in the moving body 50, this allows detecting the MPP using a simple MPP detection algorithm. That is, compared with the MPP detection by the general hill-climbing method, this decreases calculation amount and makes calculation speed faster. Thus, this significantly decreases power consumption in the tracking control device 20. In other words, this increases power generation amount (extracted electric energy) in the whole photovoltaic apparatus (the photovoltaic module 51 and the MPPT control unit 52), which includes the tracking control device 20.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

What is claimed is:

1. A photovoltaic apparatus comprising:
a photovoltaic module that includes a plurality of series portions coupled in parallel, the series portion including a plurality of photovoltaic elements coupled in series, the photovoltaic elements coupled in a same straight row of the plurality of series portions being coupled parallel to one another; and
a tracking control device configured to perform a maximum power point tracking control on an output of the photovoltaic module, wherein
the photovoltaic module includes a temperature sensor configured to detect a real panel temperature when the photovoltaic module is operating, wherein
the tracking control device includes:
    a storage unit where a plurality of panel temperature-output correlation characteristics are registered corresponding to the panel temperature, the panel temperature-output correlation characteristic preliminarily specifying a correlation relationship between the panel temperature and a characteristic of the output in the photovoltaic module;
    an output characteristic selecting unit configured to: extract one of the panel temperature-output correlation characteristics corresponding to the real panel temperature among the plurality of panel temperature-output correlation characteristics as a virtual panel temperature-output correlation characteristic; and select a maximum power operating voltage corresponding to a maximum output in the virtual panel temperature-output correlation characteristic; and
    a search start setting unit configured to extract an electric power of the photovoltaic module when a voltage of the photovoltaic module is set to a search start voltage higher than the maximum power operating voltage, as a search electric power when a search is started, wherein
the tracking control device is configured to: start a search using the search start voltage and the search electric power when the search is started as references; and extract a maximum power point of the photovoltaic module at the real panel temperature.

2. The photovoltaic apparatus according to claim 1, wherein
the photovoltaic module employs a distributed arrangement where a layout pattern of the photovoltaic elements is different from an arrangement in an equivalent circuit.

3. The photovoltaic apparatus according to claim 1, wherein
the tracking control device includes:
    a search processor configured to extract the electric power of the photovoltaic module as a search electric power for search, the electric power being obtained when a voltage of the photovoltaic module is sequentially decreased from the search start voltage by a preliminarily set search unit voltage every time so as to be set to a search voltage for search;
    a search power comparator configured to compare the search electric power before the voltage of the photovoltaic module is decreased by the search unit voltage with the search electric power when the voltage of the photovoltaic module is decreased by the search unit voltage; and
    a search control unit configured to:
        set the voltage of the photovoltaic module before decreasing by the search unit voltage to a maximum power operating voltage at the real panel temperature and terminate the search in a case where the search electric power before the voltage of the photovoltaic module is decreased by the search unit voltage is higher than the search electric power when the voltage of the photovoltaic module is decreased by the search unit voltage; and
        replace the search electric power before decreasing by the search unit voltage with the search electric power when decreased by the search unit voltage so as to perform a process in the search power comparator in a case where the search electric power before the voltage of the photovoltaic module is decreased by the search unit voltage is lower than the search electric power when the voltage of the photovoltaic module is decreased by the search unit voltage.

4. The photovoltaic apparatus according to claim 1, wherein
the panel temperature-output correlation characteristic registered in the storage unit associates the panel temperature with the maximum power operating voltage, the maximum power operating voltage corresponding to the maximum output obtained by a preliminarily assumed lighting intensity at the panel temperature.

5. The photovoltaic apparatus according to claim 4, wherein
in a case where the real panel temperature is different from the panel temperature registered in the storage unit, the output characteristic selecting unit extracts the panel temperature-output correlation characteristic corresponding to the panel temperature that is lower than and closest to the real panel temperature among the panel temperatures registered in the storage unit as the virtual panel temperature-output correlation characteristic.

6. The photovoltaic apparatus according to claim 1, wherein
the search start voltage is calculated by a formula for computation, the formula for computation being preliminarily specified with respect to the maximum power operating voltage.

7. The photovoltaic apparatus according to claim 6, wherein
the formula for computation is used to obtain the search start voltage by multiplying the maximum power operating voltage by a coefficient larger than one.

8. The photovoltaic apparatus according to claim 6, wherein
the formula for computation is used to obtain the search start voltage based on an open circuit voltage of the photovoltaic module and the maximum power operating voltage.

9. The photovoltaic apparatus according to claim 3, wherein
the search unit voltage is set to be smaller than ½ of difference between the maximum power operating voltage and the search start voltage.

10. A moving body for running with a motor comprising:
a photovoltaic apparatus that includes a photovoltaic module and a tracking control device configured to perform a maximum power point tracking control on an output of the photovoltaic module;
a cell power supply charged by the photovoltaic apparatus; and
a motor configured to operate with electric power supplied from the cell power supply, wherein
the photovoltaic apparatus is the photovoltaic apparatus according to claim 1.

11. A maximum power point tracking control method in a photovoltaic apparatus, wherein
the photovoltaic apparatus includes:
a photovoltaic module that includes a plurality of series portions coupled in parallel, the series portion including a plurality of photovoltaic elements coupled in series, the photovoltaic elements coupled in a same straight row of the plurality of series portions being coupled parallel to one another; and
a tracking control device configured to perform a maximum power point tracking control on an output of the photovoltaic module, wherein
the photovoltaic module includes a temperature sensor configured to detect a real panel temperature when the photovoltaic module is operating, wherein
the tracking control device includes:
a storage unit where a plurality of panel temperature-output correlation characteristics are registered corresponding to the panel temperature, the panel temperature-output correlation characteristic preliminarily specifying a correlation relationship between the panel temperature and the output characteristic in the photovoltaic module;
an output characteristic selecting unit; and
a search start setting unit, wherein
the maximum power point tracking control method comprises:
a step of detecting a real panel temperature by the temperature sensor;
a step of extracting one of the panel temperature-output correlation characteristics corresponding to the real panel temperature among the plurality of panel temperature-output correlation characteristics as a virtual panel temperature-output correlation characteristic, and selecting a maximum power operating voltage corresponding to a maximum output in the virtual panel temperature-output correlation characteristic by the output characteristic selecting unit;
a step of extracting an electric power of the photovoltaic module when a voltage of the photovoltaic module is set to a search start voltage higher than the maximum power operating voltage, as a search electric power when a search is started, by the search start setting unit; and
a step of starting a search using the search start voltage and the search electric power when the search is started as references, and extracting a maximum power point of the photovoltaic module at the real panel temperature by the tracking control device.

12. A computer program for a computer to execute a maximum power point tracking control in a photovoltaic apparatus, wherein
the photovoltaic apparatus includes:
a photovoltaic module that includes a plurality of series portions coupled in parallel, the series portion including a plurality of photovoltaic elements coupled in series, the photovoltaic elements coupled in a same straight row of the plurality of series portions being coupled parallel to one another; and
a tracking control device configured to perform a maximum power point tracking control on an output of the photovoltaic module, wherein
the photovoltaic module includes a temperature sensor configured to detect a real panel temperature when the photovoltaic module is operating, wherein
the tracking control device includes:
a storage unit where a plurality of panel temperature-output correlation characteristics are registered corresponding to the panel temperature, the panel temperature-output correlation characteristic preliminarily specifying a correlation relationship between the panel temperature and the output characteristic in the photovoltaic module;
an output characteristic selecting unit; and
a search start setting unit, wherein
the computer program causes a computer to execute:
a step of detecting a real panel temperature using the temperature sensor by the tracking control device;
a step of extracting one of the panel temperature-output correlation characteristics corresponding to the real panel temperature among the plurality of panel temperature-output correlation characteristics as a virtual panel temperature-output correlation characteristic, and selecting a maximum power operating voltage corresponding to a maximum output in the virtual panel temperature-output correlation characteristic by the output characteristic selecting unit;
a step of extracting an electric power of the photovoltaic module when a voltage of the photovoltaic module is set to a search start voltage higher than the maximum power operating voltage, as a search electric power when a search is started, by the search start setting unit; and
a step of starting a search using the search start voltage and the search electric power when the search is started as references, and extracting a maximum power point of the photovoltaic module at the real panel temperature by the tracking control device.

* * * * *